(12) United States Patent
Belkin

(10) Patent No.: US 10,622,946 B1
(45) Date of Patent: Apr. 14, 2020

(54) FREQUENCY MIXER

(71) Applicant: Sam Belkin, San Diego, CA (US)

(72) Inventor: Sam Belkin, San Diego, CA (US)

( * ) Notice: Subject to any disclaimer, the term of this patent is extended or adjusted under 35 U.S.C. 154(b) by 0 days.

(21) Appl. No.: 16/223,641

(22) Filed: Dec. 18, 2018

Related U.S. Application Data

(63) Continuation-in-part of application No. 15/228,978, filed on Aug. 4, 2016, now abandoned.

(60) Provisional application No. 62/201,489, filed on Aug. 5, 2015.

(51) Int. Cl.
*H03D 7/14* (2006.01)
*H04B 1/30* (2006.01)

(52) U.S. Cl.
CPC ......... *H03D 7/1441* (2013.01); *H03D 7/1466* (2013.01); *H03D 7/1475* (2013.01); *H04B 1/30* (2013.01); *H03D 2200/0043* (2013.01)

(58) Field of Classification Search
None
See application file for complete search history.

(56) References Cited

U.S. PATENT DOCUMENTS

| | | | | |
|---|---|---|---|---|
| 6,057,714 A * | 5/2000 | Andrys | ................ | H03D 9/0675 327/105 |
| 6,239,645 B1 | 5/2001 | Tsukahara et al. | | |
| 6,653,885 B2 | 11/2003 | Wu et al. | | |
| 6,999,747 B2 * | 2/2006 | Su | ......................... | H03D 7/165 327/116 |
| 7,559,675 B2 | 10/2009 | Mu et al. | | |
| 7,962,114 B2 * | 6/2011 | Garcia | ................. | H03D 7/1441 327/122 |
| 8,004,342 B2 * | 8/2011 | Huang | ................. | H03D 7/1441 327/355 |
| 8,013,651 B2 * | 9/2011 | Lee | ....................... | H03D 7/1441 327/231 |
| 8,050,644 B1 * | 11/2011 | Cosand | ................ | H03D 7/1441 455/295 |
| 8,364,112 B2 | 1/2013 | Xie et al. | | |
| 8,442,470 B1 * | 5/2013 | Tu | ........................... | H04B 1/525 455/114.1 |
| 8,446,205 B2 | 5/2013 | Sakamoto et al. | | |
| 8,649,749 B2 * | 2/2014 | He | .......................... | H04B 1/28 330/252 |
| 8,818,310 B2 | 8/2014 | Bagger | | |
| 8,818,318 B2 | 8/2014 | Kim et al. | | |
| 9,306,777 B2 * | 4/2016 | Park | ..................... | H03H 19/004 |
| 2002/0102958 A1 | 8/2002 | Buer | | |
| 2017/0063345 A1 | 3/2017 | Anegawa | | |

\* cited by examiner

*Primary Examiner* — Jeffery S Zweizig

(57) ABSTRACT

A radio frequency (RF) mixer is provided. The RF mixer includes two linear-in-the-amplitude-domain RF channels connected in parallel, with each of the two linear-in-the-amplitude-domain RF channels having of an input RF signal applied equally to each channel. Two controllable gain devices are structured to receive the input RF signal. A local oscillator (LO) communicates with both of the controllable gain devices, with one of the controllable gain devices receiving a signal from the LO directly, and the other controllable gain device receiving a signal from the LO after a phase of the LO signal is reversed by a phase inverter. Finally, an output of each of the linear-in-the-amplitude-domain RF channels is combined to form a common intermediate frequency (IF) output.

20 Claims, 29 Drawing Sheets

Simulated output signal for a parallel FET mixer circuit

Figure 13. Two parallel time varying channels

The differential version of the parallel time-varying imaginary harmonic mixer

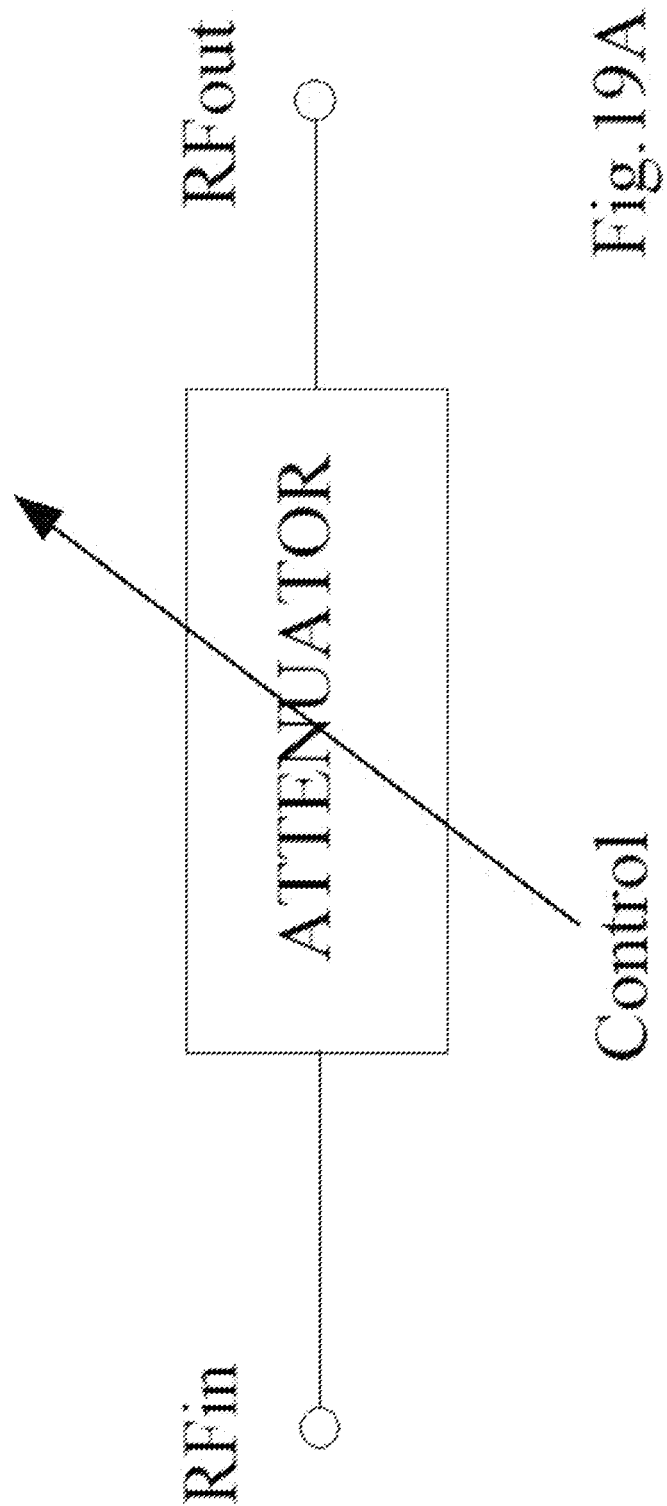

FREQUENCY MIXER

REFERENCE TO RELATED APPLICATION

This application is a continuation-in-part of co-pending application Ser. No. 15/228,978, filed Aug. 4, 2016, entitled "Frequency Converter," which claims priority to U.S. Provisional application Ser. No. 62/201,489, filed Aug. 5, 2015, entitled "Frequency Converter," which is incorporated herein by reference in its entirety.

FIELD OF THE INVENTION

The present invention generally relates to the field of radio frequency circuitry, and specifically applies to frequency mixing technologies.

BACKGROUND OF THE INVENTION

In analog circuitry, a frequency mixer is also known as a "mixer," "converter," "detector," "multiplier," and sometimes "modulator." For the purpose of this document, all those terms are interchangeable, and the general term "mixer" shall equate to all variations in terminology. Mixer circuits are characterized by multiple (usually two) input ports at differing frequencies and at least one output port at which appears at least the sum and difference of the two inputs, and can also include the sums and differences of harmonics of the two inputs, potentially creating a complex waveform. Those many frequencies appearing in the output of the mixer are typically applied to the input of a filter of appropriate selectivity (narrow bandpass) to permit selection of the frequency(ies) most useful in the overall design, and suppression of other frequencies.

In most mixer circuits, at least one of the input frequencies is variable, or controllable, by either automated or manual means. Such control determines the output of the mixer circuit. That controllable input is usually called the local oscillator, or LO.

One problem with existing mixers is that they use non-linear components that create distortion of the output signal, which limits the performance of the overall system.

Typical mixers are comprised of a nonlinear component or circuit to which the signal frequency and the LO frequency are simultaneously applied. The result is a form of intermodulation, as multiple signals are created when the signals of the two frequencies interact with each other. Intermodulation products can be very complex, but it will be the subsequent filter at the output port—usually a bandpass filter—that extracts the desired signal and suppresses others.

Among the simplest nonlinear components used in mixers is a diode, which produces the original frequencies as well as their sum and their difference, along with many other mixing products. Complex mixers are comprised of many individual components, and provide the circuit designer with multiple options. But simple and complex mixers use non-linear components which, by definition, produce output characteristics that reduce the performance of the overall system.

In a typical radio circuit, the output of the antenna will usually contain many carrier frequencies generated by multiple signals received from multiple transmitters. Early radio designers learned that it is difficult to manage and manipulate such a complex signal, but relatively easier to convert the desired signal to a standardized carrier frequency that is manageable, enabling the subsequent circuitry to be optimized for performance at that single frequency. In radios, that standardized frequency is usually called the Intermediate Frequency (IF). In the mixer, those multiple frequencies are combined with a controllable signal, the LO, which is varied to control the output of the mixer to generate that IF standard, among other mixer products. If a selective filter follows the mixer, then controlling the LO can shift the desired carrier frequency to that which will pass the selective filter, the output of which then becomes the IF, the signal to which the rest of the system has been tuned. That tuning circuit is usually followed by various forms of demodulation (extraction of a carrier's content) and amplification.

In a simple amplitude modulation (AM) radio, the antenna simultaneously receives many broadcast stations (frequencies), but the combination of an LO, a mixer, and a filter permits the user to tune the system to the desired station.

Obviously, the mixer—the frequency converter—is a critical component of any radio, and of many other types of electronic circuits; the mixer has a major influence upon the overall performance of the system.

Existing mixer architectures appearing in the prior art (market, professional papers, patent filings) are generally combinations of compromises that require the designer to deal with various permutations of cost, size, reliability, performance, complexity, power dissipation, and other potentially problematic issues. Worse, imperfect mixer performance multiplies problems in subsequent circuitry. The mixer, therefore, is fundamentally important in radio frequency circuit design, and can have a profound effect upon overall system merit.

A mixer design is characterized by cost, size, and power dissipation, and also by these performance specifications:

CONVERSION LOSS is a measure of the efficiency of the mixer in providing frequency translation from the input signal to the output signal. Conversion loss of a mixer is equal to the ratio of the IF single sideband output power to the RF input power, expressed as a positive number in dB. The lower the loss, the more efficient the mixer. In many designs, one or another of the mixer's inputs and/or outputs are amplified within the overall mixer circuit, thus enabling the management of conversion loss and even providing conversion GAIN, but amplification by its nature introduces noise and other artifacts.

CONVERSION COMPRESSION is a measure of the maximum RF input signal for which the mixer will provide linear operation in terms of constant conversion loss. This specification enables the comparison of dynamic range for various mixers, and the maximum input power.

ISOLATION is a measure of the circuit balance within the mixer. When isolation is high, the "leakage" or "feed through" between mixer ports will be small, and the inverse is true. Typically, mixer isolation falls off with frequency due to the imbalance of any transformer, lead inductance, and capacitive imbalance between mixer circuit components such as diodes.

DYNAMIC RANGE is the signal power range over which a given mixer design operates effectively without conversion compression. The conversion compression point identifies the upper limit of dynamic range; the NOISE FIGURE, the BANDWIDTH, and the level of INTER-MODULATION PRODUCTS of the mixer circuit identify the lower limit of dynamic range.

INTERMODULATION distortion takes place when two RF signals simultaneously enter the mixer non-linear RF port and interact to produce modulation of either signal by the other, resulting in undesired signal artifacts. This can occur in a multiple-carrier signal environment, or when an undesired signal interferes with a desired one. Also, an imperfect mixer generates its own intermodulation distortion due to its non-linearity. The products resulting from the interaction are usually objectionable, and impose limits upon the design of the overall circuit when they fall within the frequency range of the mixer output.

INTERCEPT POINT is a commonly accepted and useful method of describing the capability of a mixer to suppress two-tone, third order intermodulation distortion, using the "third-order intercept" approach. The third-order intercept point (IP3) is a theoretical location on the output versus input line where the desired output signal (each of the two tones) and the two third-order products (each one) become equal in power, as RF input power is raised. This single mixer specification usually defines the overall performance of the mixer design, and its utility in the circuit.

The ideal frequency mixer is essentially linear, with output spectra that include fewer artifacts and noise than less ideal designs. In such an optimized design the mixing function generates fewer products or artifacts from the input and LO signals. In conventional mixer designs, LO current does flow through the device that accomplishes the mixing, and that device is typically nonlinear.

A theoretically ideal mixer will generate the desired output with no artifacts and noise, and most specifically no output energy resulting from LO currents flowing through the mixer device.

Even in an idealized mixer, there can be some products or signal artifacts due to angle cuttings. However, compared to mixers in the prior art, the idealized mixer will generate these products at a significantly lower power level, and their effect on overall system performance will be less. Mixers in the prior art are defined by the specification called the 3rd intercept point (IP3), and conventional mixers achieve an IP3 level at about 20 dBm. This single specification defines mixer performance.

The current invention is a mixer architecture that uses linear devices such as field effect transistors (FETs) as LO-controlled variable resistors, or actual variable resistors, or another linear variable device, and avoids LO current within the mixer circuit, thus achieving significantly higher IP3 numbers. This parameter supports very aggressive circuit designs not previously possible, and overall system performance not previously achievable.

1. Prior Art

In the professional literature, commercial market, and in the files of various patent offices, there exist hundreds of different mixer designs. All seek to produce a commercially viable combination of linearity, cost, conversion loss, reliability, and similar factors, but none use the architecture of the present invention, and none provide performance of the parallel channel mixing circuit used in an embodiment of the present invention. All designs that use nonlinear devices produce an IP3 parameter that is well below the performance of the present invention.

Many excellent mixer configurations have been developed. However, evolving systems can benefit from clarity that is not possible with nonlinear devices, and the inherent problems of conventional mixers put an ever-increasing burden on the circuit designer, requiring compromises in critical areas. Ordinary design compromises are generally not necessary when the present invention is used.

2. Objectives of the Present Invention

The present invention provides circuit designers with a cost-effective mixer that has an IP3 (third order intercept point), and also higher order IPs, substantially improved over the capabilities of conventional mixer technologies.

Brief Summary of the Present Invention

The present invention is a mixer or frequency converter that uses field effect transistors, resistors, or other linear devices/circuits as controllable mixing devices, in circuits that prevent local oscillator (LO) currents from appearing in the mixer, thus providing features, functions, and performance not achieved by conventional designs.

BRIEF DESCRIPTION OF THE DRAWINGS

FIG. 19A-C illustrates components of the RF mixer shown in FIG. 18.

Figure 1:
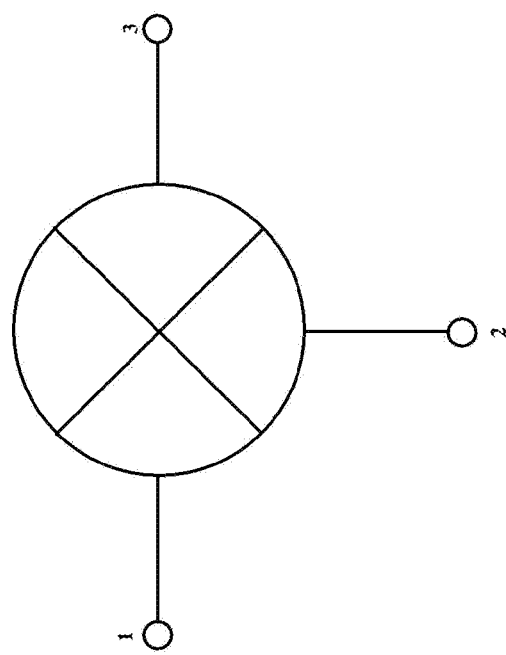
FIG. 1 describes a common mixer architecture.

It will be recognized that some or all of the Figures are schematic representations for purposes of illustration and do not necessarily depict the actual relative sizes or locations of the elements shown. Unless otherwise specifically noted, articles depicted in the drawings are not necessarily drawn to scale. The Figures are provided for the purpose of illustrating one or more embodiments of the invention with the explicit understanding that they will not be used to limit the scope or the meaning of the claims.

DETAILED DESCRIPTION OF THE PREFERRED EMBODIMENTS

In the following description, for the purposes of explanation, numerous specific details are set forth in order to provide a thorough understanding of the frequency mixer, or mixer that embodies principals of the present invention. It will be apparent, however, to one skilled in the art that the mixer may be practiced without some of these specific details. Throughout this description, the embodiments and examples shown should be considered as exemplars, rather than as limitations on the mixer. That is, the following description provides examples, and the accompanying drawings show various examples for the purposes of illustration. However, these examples should not be construed in a limiting sense as they are merely intended to provide examples of the mixer rather than to provide an exhaustive list of all possible implementations of the frequency mixer.

Unless defined otherwise, all technical and scientific terms used herein have the same meaning as is commonly understood by one of skill in the art to which this invention belongs. In event the definition in this section is not consistent with definitions elsewhere, the definitions set forth in this section will control.

Specific embodiments of the invention will now be further described by the following, non-limiting examples which will serve to illustrate various features. The examples are intended merely to facilitate an understanding of ways in which the invention may be practiced and to further enable those of skill in the art to practice the invention. Accordingly, the examples should not be construed as limiting the scope of the invention. In addition, reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Mixers are very important and complex parts of RF and microwave systems. They provide frequency conversion and mixing as required by the system architecture. Unfortunately, mixers are non-linear devices by definition and therefore produce parasitic or spurious signals. The goal is a mixer that will mix signals linearly without introducing spurious components in the output.

Traditional mixers per FIG. 1 are non-linear devices. However, the frequency mixing device can be absolutely linear in the amplitude-frequency domain. For example, a simple resistor may work well as a mixer if its parameters are somehow changed in the time domain.

Figure 2:
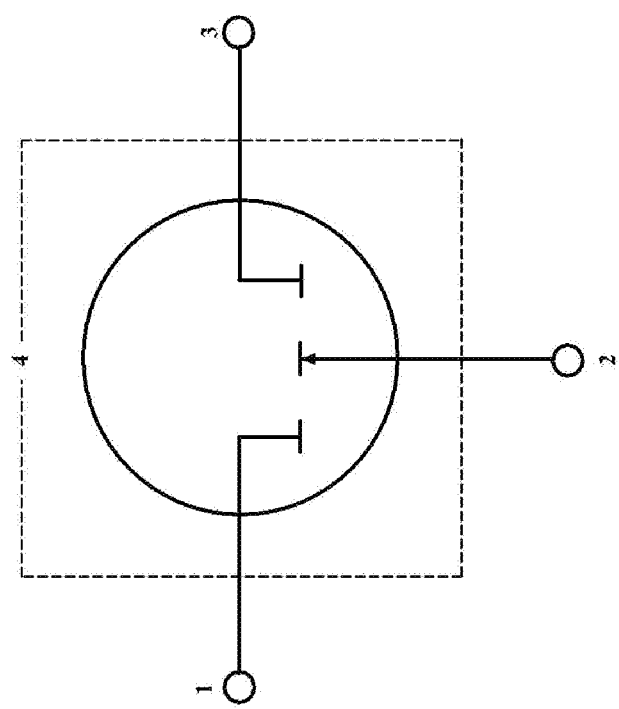
FIG. 2 describes a mixer circuit using Field Effect Transistors (FETs)

This concept applies to a new class of mixer that performs as a linear device. A variable resistor can be a good mixer, and one realization of this idea is a field effect transistor (FET) configured to operate as a variable resistor per FIG. 2. Many known mixers are based on this idea, but all of them produce artifacts in their output because electrical currents of all the participating frequencies and from the power supply are flowing through the mixer circuit, thus creating a variety of sum, difference, multiple, and submultiple signals at the mixer's output.

The present invention is a mixer in which only the RF and IF signals flow through the mixer circuit. Since there is no LO current flowing through the mixer, LO-related signal products are minimized. Of course, some of them may appear because any mixing process involves cutting input signals at some angles. This is natural to the mixing process and cannot be avoided.

As less non-linear cutting is involved in the mixing process, fewer undesired signals will be generated, and they will have relatively low amplitudes. To achieve this requires a mixing device that is as linear as possible. Linear resistance devices are good examples, and the best voltage controlled resistance devices are FET transistors. There are many different kinds of FETs, of which some can be very effective as linear variable-resistance components in mixers.

Figure 3:
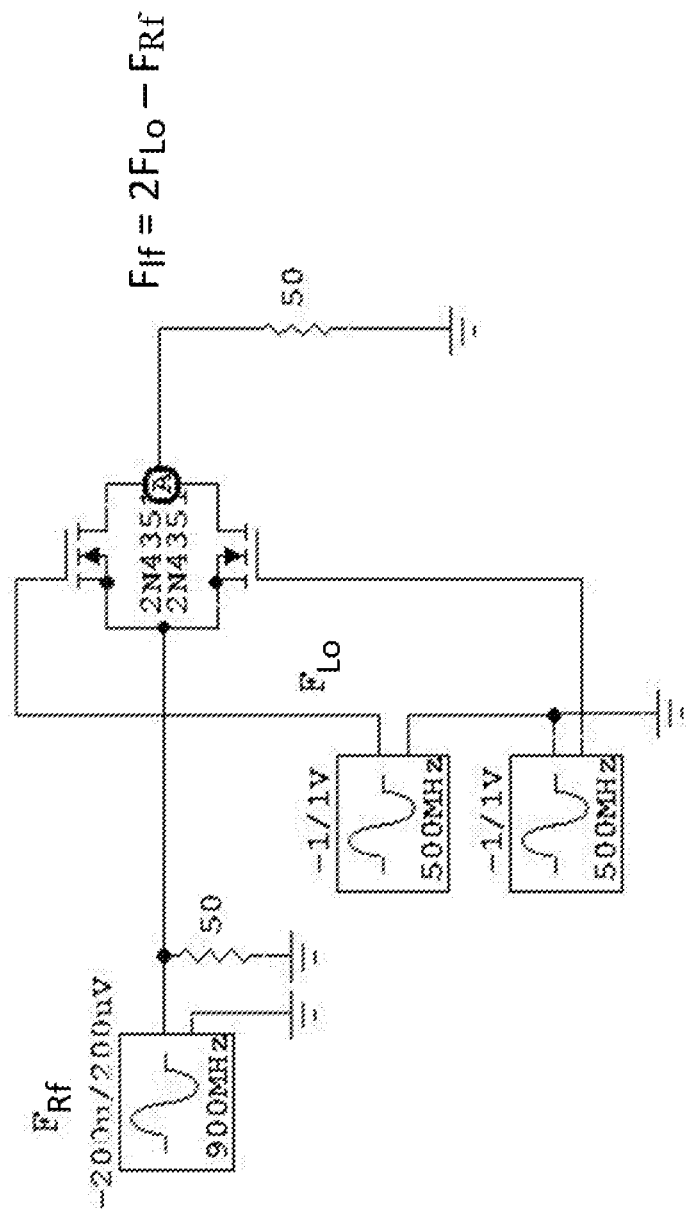
FIG. 3 describes a simple embodiment of the time varying version of the present invention.

Frequency mixing requires a non-linear circuit, and there may be several non-linearities involved in the process. Consider an FET acting as a linear resistor that can change its resistance by application of a control voltage. Changing an FET's resistance is a linear process in the amplitude-frequency domain. However, it may be linear or non-linear in the time domain. Therefore, a time-variance system may be used as in FIG. 3, and such a variation is within the scope of the present invention.

This type of electronic system employs a device with only one non-linear characteristic, and it ensures very low non-linear products. The intrinsic non-linearity of the semiconductor device is not involved in the creation of the unwanted products, and this is a major improvement compared to traditional mixing circuits. In the case of this optimized design, only the cutoff angle is the contributing factor, and that process can be evaluated with the Fourier mathematical conversion. However, it is a well-known phenomenon, first predicted by Lagrange in the early 1800s, and later by Gibbs, that show the limitations of the Fourier transform technique. Even without the Fourier math, it is clear that frequency conversion based upon a linear device produces less undesired signals compared to the traditional non-linear device.

Consider a simple mixing system based on the described linear principle. A single FET transistor can work as the adjustable resistor even without applying the source-drain voltage. When the channel resistance varies with the LO signal, the output will include mixing products of the RF and LO signals. This is a simple example of linear frequency mixing. This circuit has another important positive property: no LO signal current flows through the mixer's input and output circuits. Therefore, the output will have only the frequency components produced by resistive change, and nothing from the intrinsic non-linearity of the semiconductor device itself. The fact that the LO signal does not flow through the mixer's circuits ensures that the output will not include significant combinations of the LO with either input or output.

The best Gilbert-cell based mixer of today's electronics can do a good job of mixing, but in addition to mixed signals, the output includes many undesired frequencies of which most are produced by the non-linearity of the semiconductor device(s). Usage of the linear resistive mixing element can reduce these unwanted products, and there are other ways to improve the mixing.

One of the fundamental problems in mixing technology is the LO voltage. It is the most powerful signal in the circuit and it produces the most powerful products. By eliminating that powerful source of unwanted signals, the result is a mixer with much improved output. With an FET mixer it is possible to eliminate the LO currents from the circuit.

Figure 4:
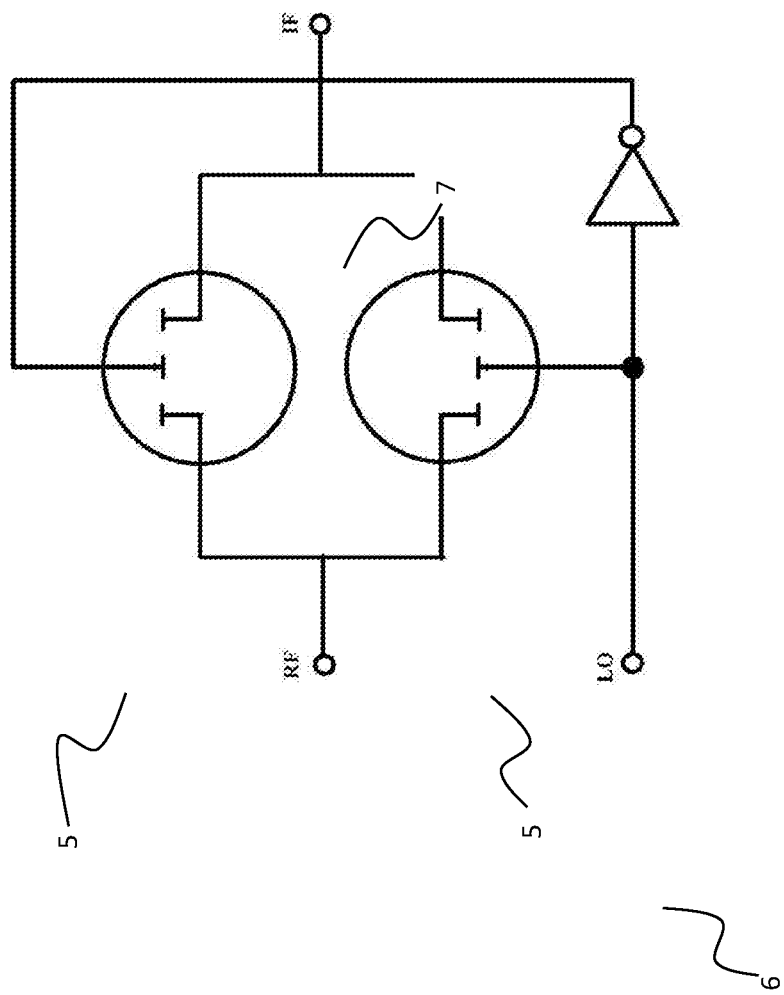
FIG. 4 describes the present invention as an FET Parallel Mixer with time varying.
Figure 5:
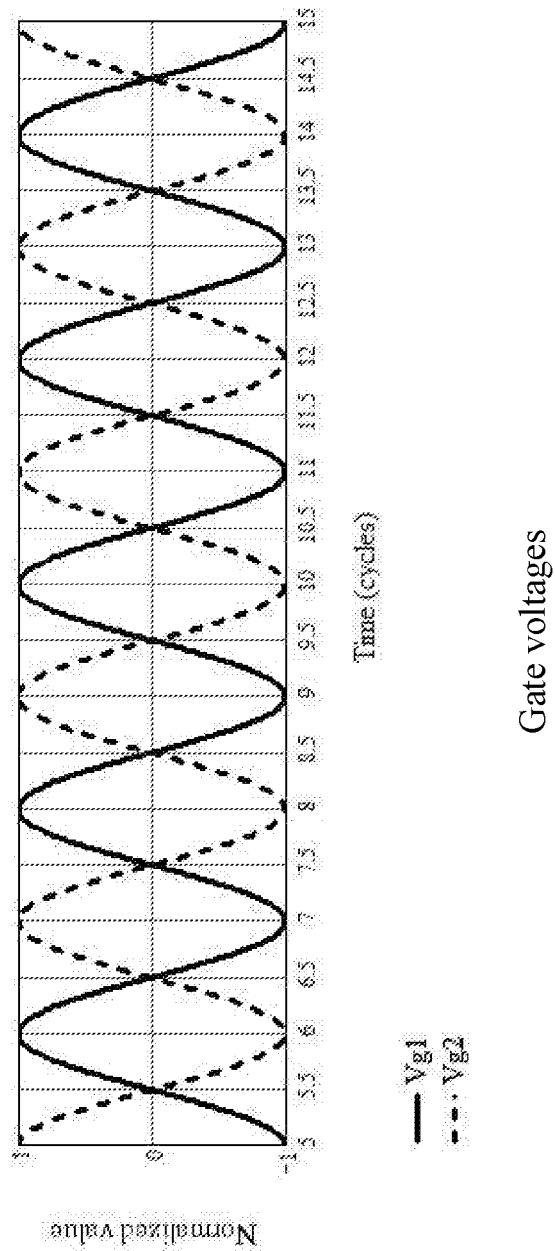
FIG. 5 shows the gate voltage of parallel FETS as a mixer.
Figure 6:
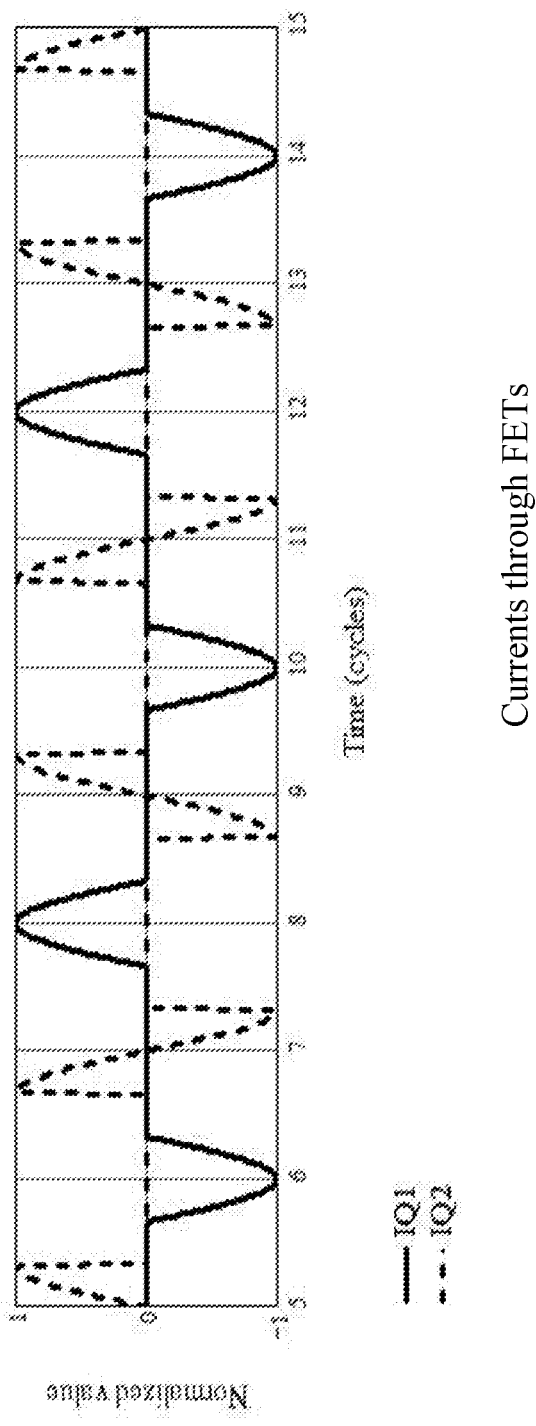
FIG. 6 shows currents through FETs.
Figure 7:
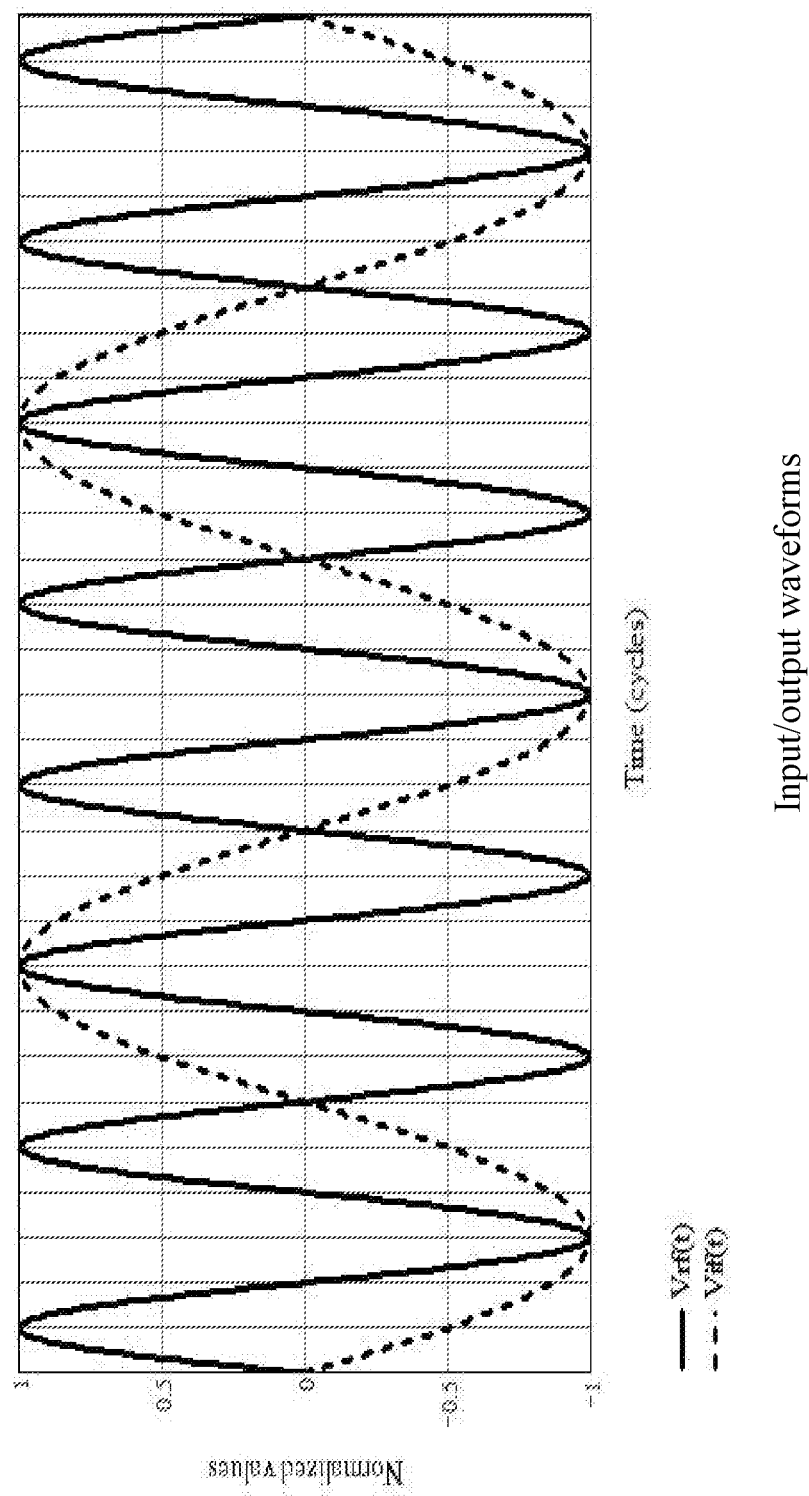
FIG. 7 shows input/output waveforms.

Another method to further reduce the LO current effect on mixer performance is by connecting two equal channels of controlled resistance as shown in FIG. 4. In that circuit, the conductance of each FET is controlled by opposite phase LO signals, and each FET will conduct every one half of the cycle of the LO. Therefore, the RF signals will be transferred to the IF output twice per LO period. This implies IF=RF±2·LO In a well-balanced bridge such as that in an embodiment of the present invention in FIG. 5, no currents at the LO frequency flow through the mixer's circuit, as in FIG. 6. Physically, there is also no LO current because the gate circuit is isolated from the source-drain path, with input/output waveforms as shown in FIG. 7.

Define time scale in cycles     t: = 5, 5.01 . . . 15
Normalized RF input frequency    $F_{rf}$: = 0.75

| | |
|---|---|
| Normalized LO frequency | $F_{lo}$: = 0.5 |
| FET threshold voltage | Vt: = 0.5 |
| Define input signals | $V_{rf}(t)$: = cos(2π $F_{rf}$ t) |
| | $V_{g1}(t)$: = cos [(2π $F_{lo}$) t] |
| | Vg2(t): = cos(2π $F_{lo}$ t + π) |
| Define currents through FETs | IQ1(t): = if(Vg1(t) > Vt, Vrf(t), 0) |
| | IQ2(t): = if(Vg2(t) > Vt, Vrf(t), 0) |
| Output IF signal | Vif(t): = cos[(2 · Flo − Frf) · 2 · π · t] |

Figure 8:
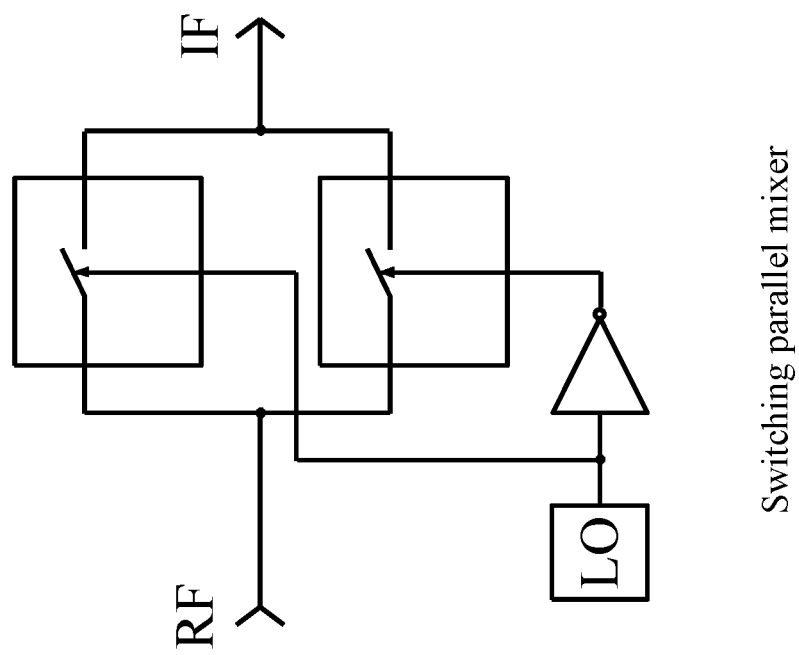
FIG. 8 shows a switching parallel mixer.

The resistive mixer is not the only possible solution for linear mixing. Another embodiment of the present invention is the parallel switching technology shown in FIG. 8.

This configuration uses two RF switches with good RF performance. In this embodiment of the present invention, the third order intercept point value can be up to 86 dBm, which is far higher than mixers available in today's technology (they are typically limited to about 20 dBm). Such a mixer, together with dynamically tunable filtering technology, can provide a third order intercept point exceeding 135 dBm, a performance point once considered impossible but made achievable by the present invention.

A mixer's quality is determined by its ability to mix RF and LO signals with minimal distortions resulting in high linearity, but the mixer is intrinsically a non-linear device. There are ways in which a mixer can be made more linear, as described in the technical literature. The ideal mixer must be linear in the amplitude and frequency domain. However, it can be non-linear in the other domains that will not produce the amplitude and frequency distortion that results in spurs in the output spectrum.

Figure 9:
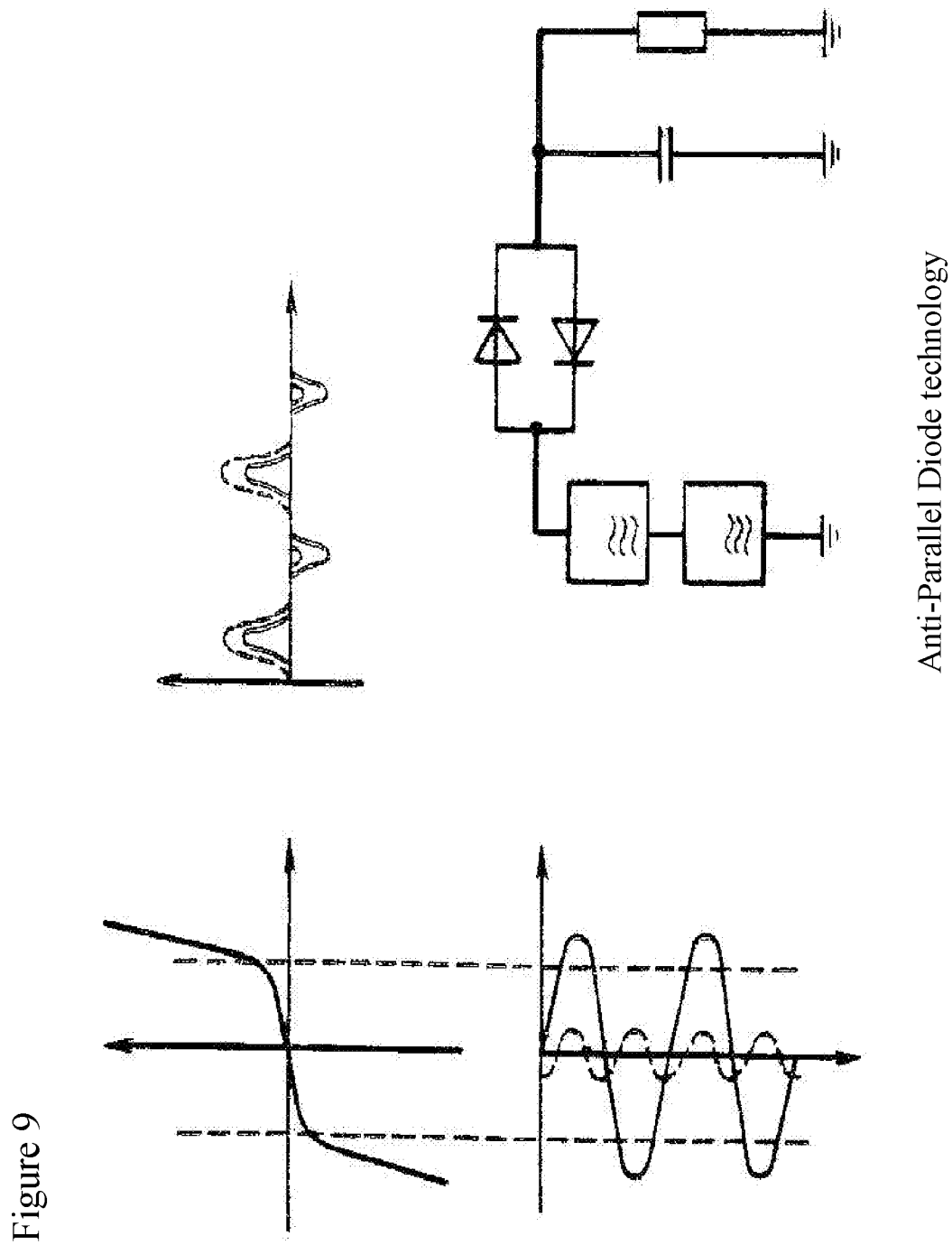
FIG. 9 shows input/output waveforms.

As mentioned, one way to improve frequency performance is to change the LO frequency and reduce the LO currents into the circuit. In addition to the method previously described, this can be achieved with subharmonic mixers that use a frequency at just a fraction of the required LO. The very simple example of this technology is the AntiParallel Diode Pair technology (APDP) shown in FIG. 9.

Volt-ampere characteristics of such inverse-paralleled diodes can be described by equation:

$$i = A*v + B*v^3$$

where A and B are constants; V=(Vrf)*Cos($\omega_{rf}$t)+(Vlo)*COS($\omega_{lo}$t)

Considering that the capacitor is shorting the high frequency component and (Vrf)<<(Vlo) the solution is:

$$i = (\tfrac{3}{4})*B*(Vrf)*[(Vlo)^2]*Cos(2\omega lo - \omega rf)t$$

This formula shows that the output current has no component with RF or LO frequencies, indicating that such mixers do not detect RF or LO voltages. However, this mixer still produces some unwanted output products of applied signals.

The electronic component that contributes least to amplitude variation is the resistor, which can be (and is used as) a mixing device. Any device that is linear in the amplitude and frequency domain element may be a mixer, because the circuit can introduce a time-varying property to the otherwise absolutely linear device. Changing resistance of the resistor in the time domain will enable the resistor to mix signals. This is a well-known phenomenon and technical publications on this subject are available.

Figure 10:
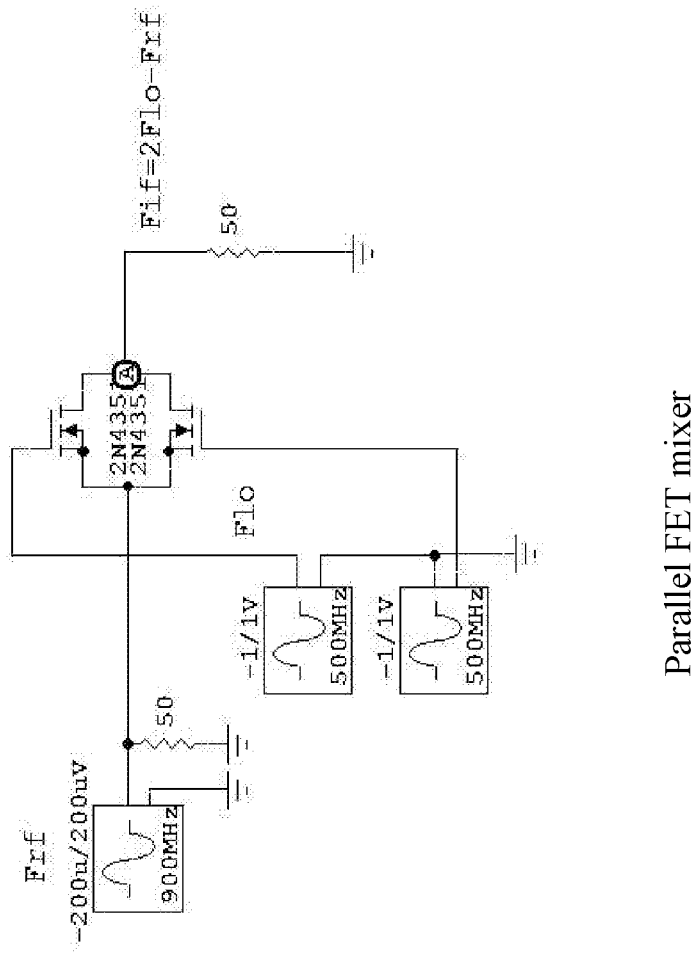
FIG. 10 shows a parallel FET mixer.

One of the possible realizations of resistive mixers, with example values, is shown in FIG. 10. In this embodiment, two equal FET's are connected in parallel to create a highly linear mixer.

Figure 11:
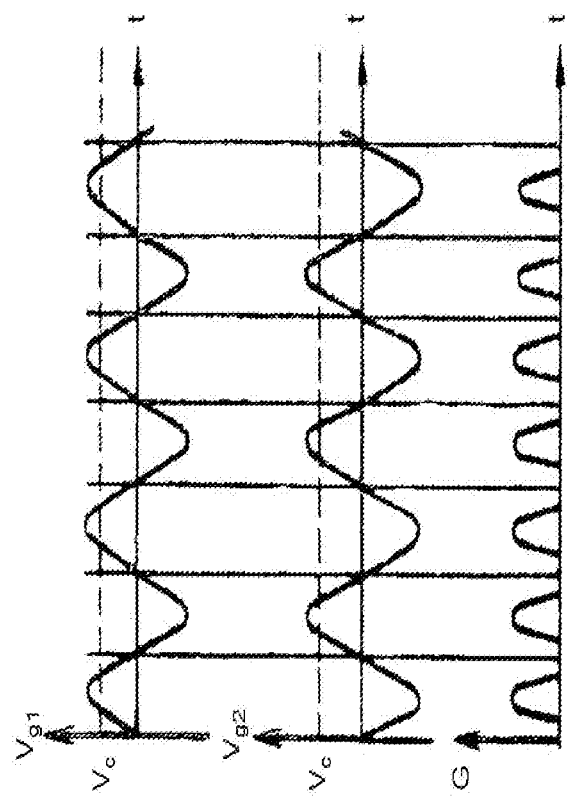
FIG. 11 shows the gate voltage vs output current.
Figure 12:
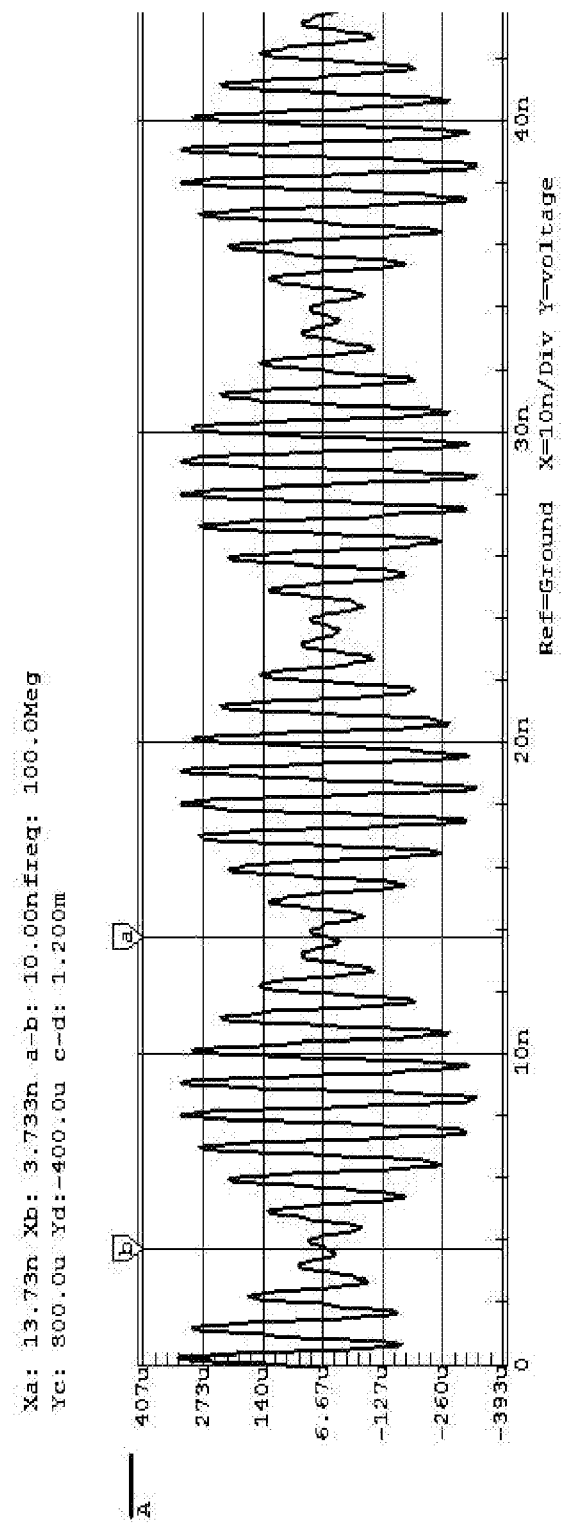
FIG. 12 shows a simulated output signal.

The gate voltages in FIG. 11 are in opposite phase and they produce the total conductance changes, presented on the lower plot—it is double the gate frequency so the output frequency will be equal to $F_{out} = F_{in} \pm 2 \cdot F_{LO}$ The simulated output waveform for the parallel FET mixer is shown in FIG. 12, in which only a product from two mixed frequencies can be seen.

Figure 13:
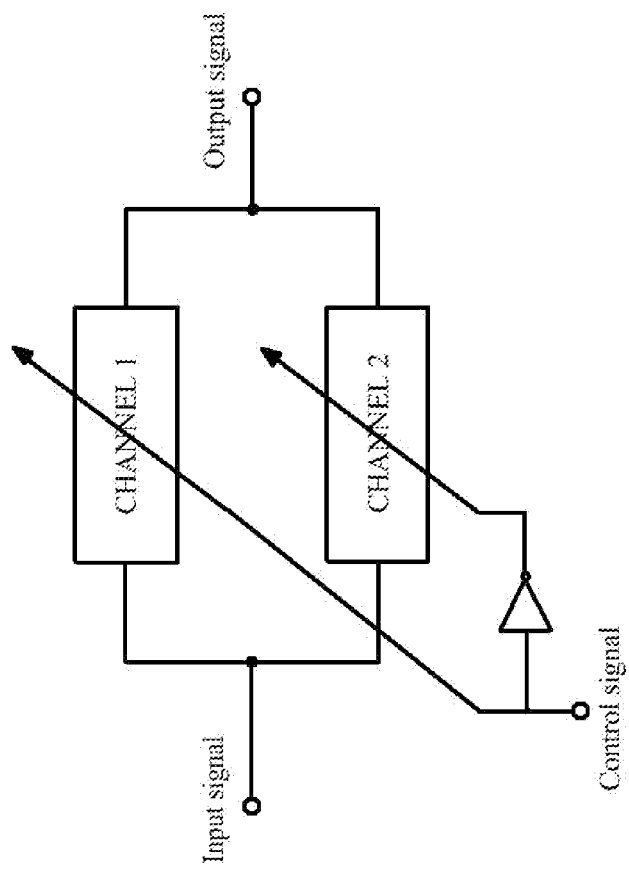
FIG. 13 shows two time varying channels.

The Imaginary Harmonic mixing embodiment of the present invention can be generalized with the interpretation presented in FIG. 13. Two time-varying channels, CHANNEL 1 and CHANNEL 2, are depicted, controlled by the LO signal. These channels can be of the varied-resistance or time-varying gain (switching) class.

Figure 14:
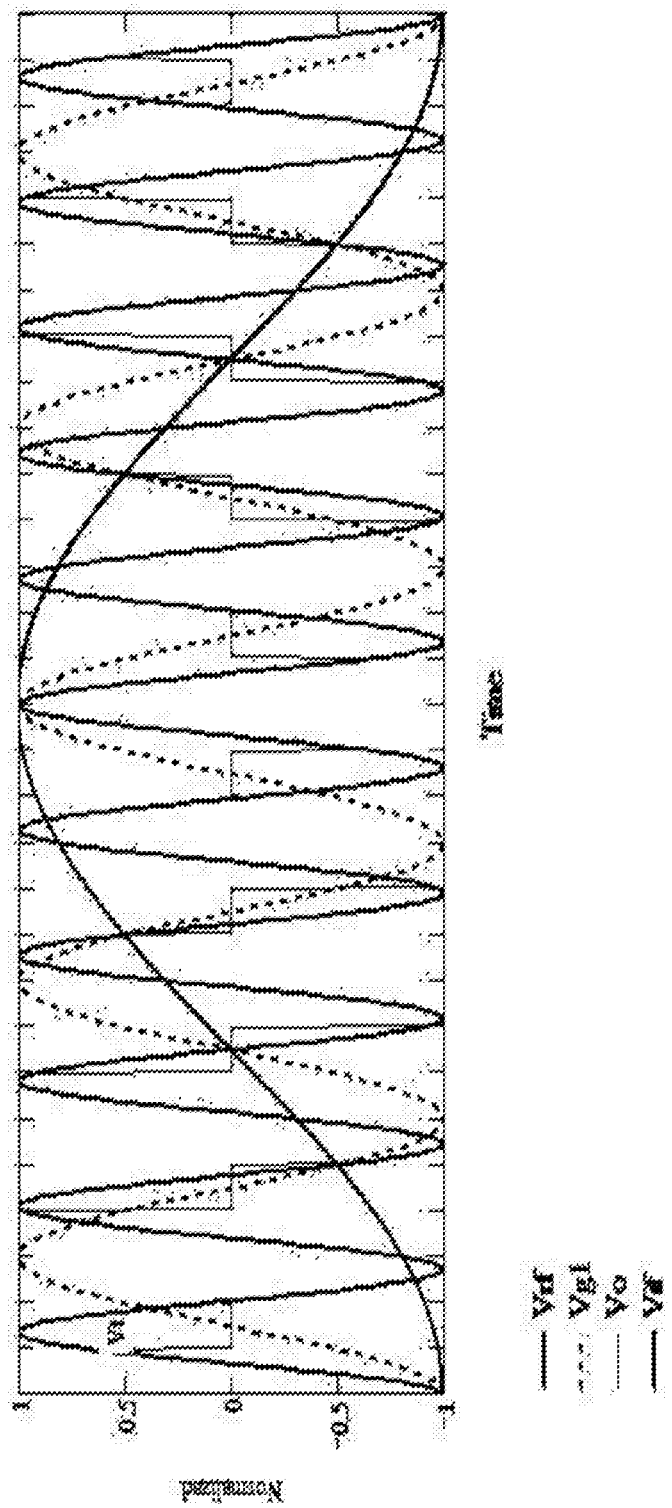
FIG. 14 shows imaginary mixer plots.

The output is filtered by a low-pass or band-pass filter and the simulated corresponding plots for this mixing technology are shown in FIG. 14.

Figure 15:
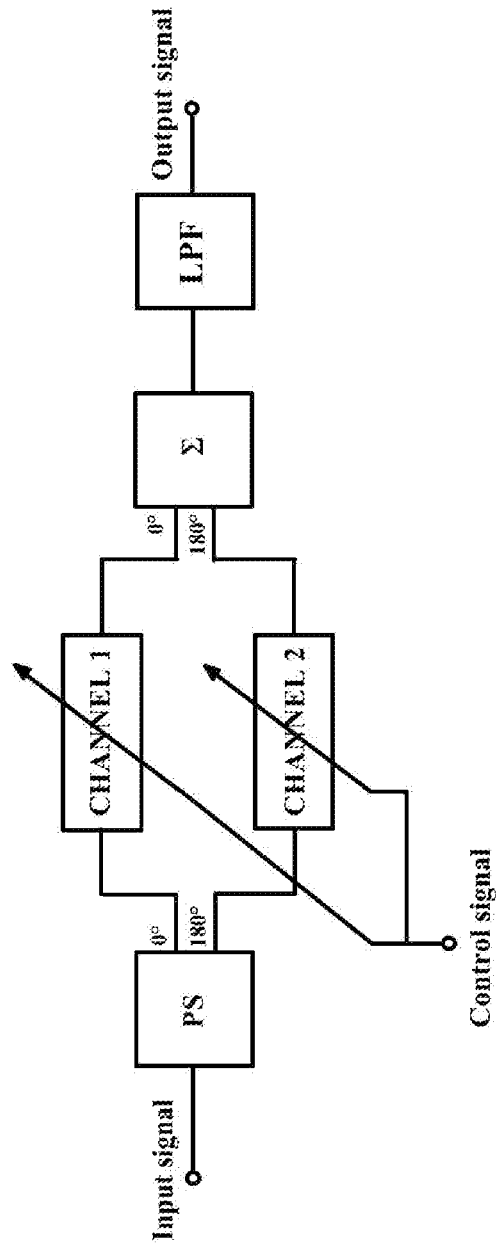
FIG. 15 shows a differential version.

The discussed time-varying mixer topology can also be realized in the differential form as presented in FIG. 15. Here PS is the phase shifter, which may be any of several known devices that produce the required 180 degree phase shift, such as a balun.

Figure 16:
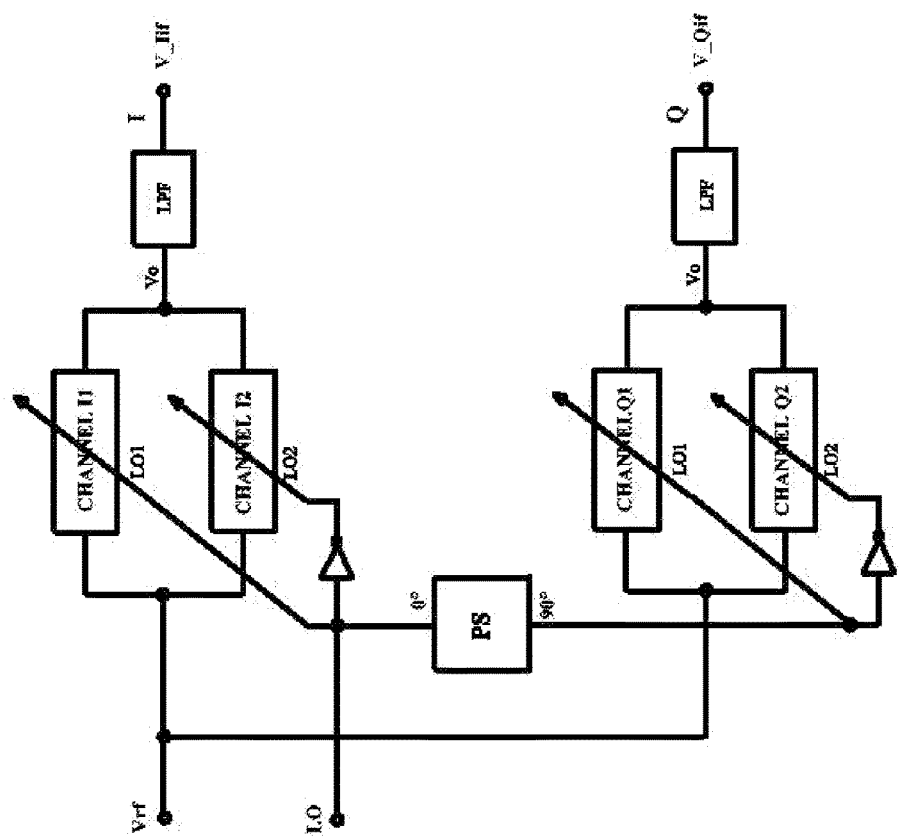
FIG. 16 shows an IQ imaginary harmonic mixer.

Time-varying topology can also be used for quadrature IQ mixers, modulators and demodulators. One of the possible realizations of the IQ IHM mixer is shown in FIG. 16.

Mixers based upon time-varying are the most linear due to very low dependence of their parameters to the levels of the input and output signals applied to the mixer. This approach will ensure the highest possible linearity of the mixer and the lowest level of intermodulation products at its output. IPn values will be improved, including the third order IP3 level which is the most important in narrow band communications.

Moreover, this technology allows configurations in which LO currents do not flow through the mixer circuit, eliminating signals generated by interactions that include the LO current, thus making the output spectrum clearer compared to other mixers.

Better linearity and clearer output spectrum are the major parameters required for advanced communication technology. This implies the wide usage of the present invention for wireless communications, radars, test equipment, and other electronic circuits of the future.

Imaginary Harmonic Mixers have one more serious advantage: the LO frequency is at least two times lower than in conventional mixers, permitting much better isolation between the LO and other parts of the circuit. For instance, in direct conversion receivers this approach will dramatically improve isolation between receiver input and LO, thus reducing the DC generated at the mixer's output. In Dynamically Tuned Filtering technology, lower LO amplitude will similarly provide better isolation between the LO and other parts of the system, useful because in such systems the LO frequency may be close to the input frequency.

Like conventional mixers, Imaginary Harmonic Mixers can use attenuators at the ports that will optimize the converter performance and simplify the ports matching.

Therefore, the present invention is a mixer (combiner, multiplier, etc.) that uses linear devices which are varied in the time domain to maximize linearity. The preferred embodiment of the present invention uses field effect transistors as variable resistors, controlled by a local oscillator (LO), with a circuit that minimizes the effect of the LO upon the output of the mixer.

Referring now to FIGS. 17-24, alternative embodiments of the present invention are illustrated. As discussed above, the present invention comprises a radio frequency (RF) mixer. In one embodiment, the present invention comprises a frequency mixer that is linear in the amplitude domain, constructed of components that are qualified by measurements independent of manufacturer specification and assembled in accordance with specific isolation standards. An external RF signal is applied to the mixer, which consists of two linear-in-the-amplitude-domain controllable channels, such as RF switches, controllable attenuators, and field effect transistors in the linear controllable resistance mode, each operated by the control signal from a local oscillator (LO) pursuant to specific waveforms.

One feature of the present invention is accomplishing a frequency mixing function without nonlinearity in the amplitude domain. One advantage of this feature is that mixing in the absence of amplitude nonlinearity will significantly improve the performance of virtually all systems and circuits that broadcast or receive radio signals.

Figure 25:
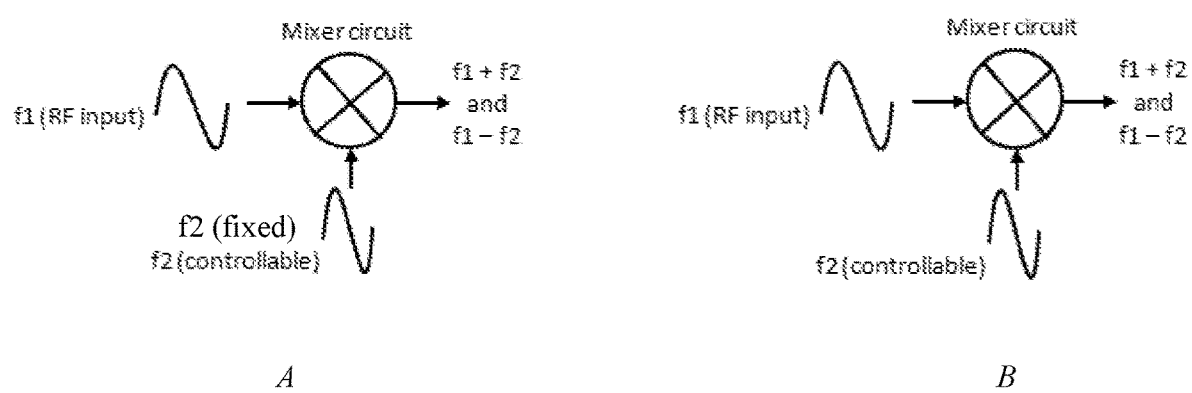
FIG 25. shows prior art mixers.

Virtually all of today's RF technologies depend on the mixing function, by which two frequencies are combined to produce sum-and-difference signals, which are then filtered to select the desired output. Prior art mixers appear in radio frequency circuits as shown in FIG. 25.

f1 comes from a radio input circuit (an antenna, for example), it can be mixed with a second frequency, to move the original signal to another point in the spectrum (per A) where another mixing stage can efficiently provide tuning (B)—a process required in radio, radar, and instrumentation, and other types of circuits.

However, all known mixers introduce spurious signals and noise, which limit the capability of the overall circuit. Those undesired signal components are due to the inherent nonlinearity-in-the-amplitude-domain of current mixer technologies. Wikipedia (and engineering reference books and publications) describe the mixing function as follows ". . . a mixer, or frequency mixer, is a nonlinear electrical circuit that creates new frequencies from two signals applied to it." The RF industry assumes that the mixing function is inherently nonlinear, which is the source of the undesired noise in the output of the circuit. The prior art includes many techniques and circuits intended to reduce nonlinearities, or to compensate for them, or to reduce the noise thus produced, but despite the labels assigned to the various "linear" mixer designs, all prior art mixer circuits are intrinsically nonlinear in the amplitude domain.

Mixer performance is defined by the parameter called the 3rd intercept point (IP3), which is a purely mathematical parameter for defining the performance of RF devices such as receivers, amplifiers, and mixers. Conventional mixers achieve an IP3 level better than 100 dBm. This important specification defines mixer and therefore system performance.

In RF circuits such as radios, system performance is dependent upon—and limited by—mixer performance. Developments in amplifiers, filters, and other circuit components have made the mixer the limiting factor in RF circuits. Many attempts have been made to accommodate the natural nonlinearity of the mixing function to improve system performance, but conventional technologies are not capable of a fundamentally linear mixing function. Such a technical achievement can improve virtually every aspect of many RF industries.

Linear mixers crate significantly less noise at the output that makes an RF system better. For example, receiver sensitivity and overall received signal quality improves. In digital communications it significantly improves the bit-error rate (BER), that in-turn increase the data rate. As results the required transmitting power may be reduced, or a longer radio link distance may be achieved. It is especially important for cellular and satellite communications, as well as for long non-line-of-site (NLOS) radio links like maritime radio lines. For radars linear mixers may provide much better signal resolution and better target detection. It will reduce the cost of equipment and its power consumption.

The present invention is the first mixing circuit that is inherently linear in the amplitude domain. The present invention can improve the IP3 figure of the mixer function by many orders of magnitude. The design goal is to cost-effectively achieve an IP3 level better than 100 dBm. Component/device performance is highly critical, and to maximize performance it is necessary to carefully select parts using parameters not often published by the manufacturer. Makers of such parts are evolving, and in the light of the present invention will recognize the opportunity it represents and begin making parts that it specifically requires.

Figure 17:
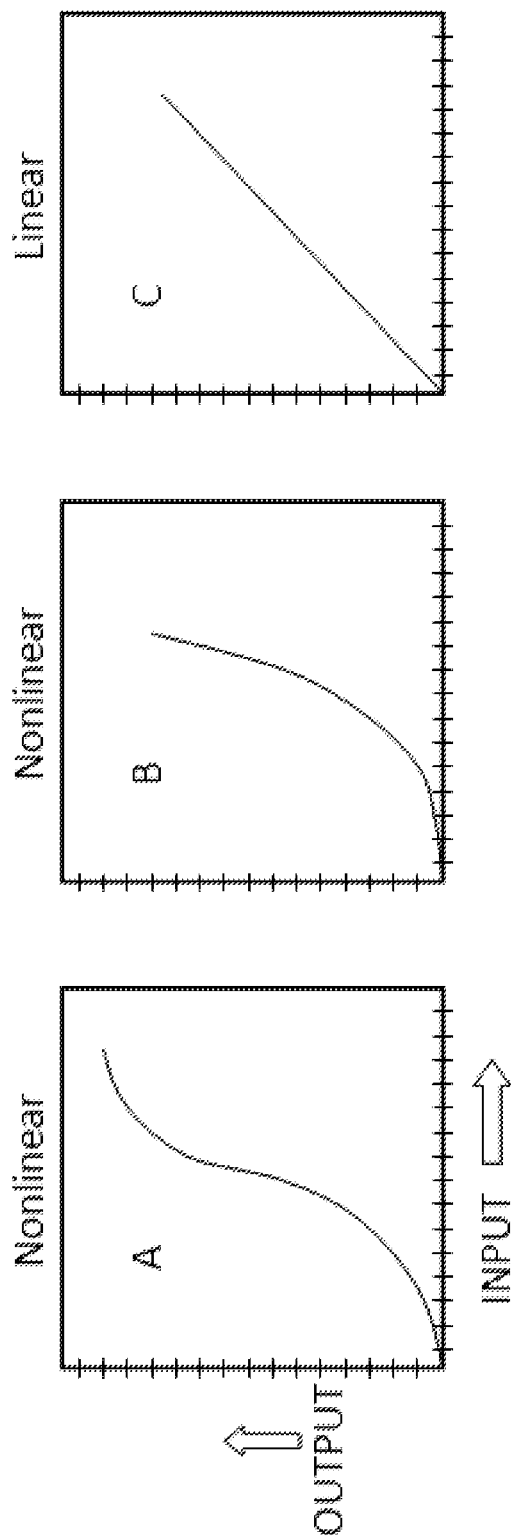
FIG. 17 illustrates the differences between linear and non-linear.

Referring now to FIG. 17, "linearity" will be discussed. A system, network, circuit, or device is considered to be linear when every given change in the input parameter produces equal changes in the output over the whole range of required input parameter swing. A system, network, circuit, or device is considered to be non-linear when a given change in the input parameter produces unequal changes in the output over the whole range of required input parameter swing. In a mixer circuit, linearity in the amplitude domain has a direct, measurable, and consistent effect upon system performance, including noise components in the output.

For a linear system, equation 2.1 describes how a circuit's output parameter(s) directly correlated with variations in input parameter(s):

$$\text{Par}_{out} = k \cdot \text{Par}_{in} \tag{2.1}$$

where: $\text{Par}_{out}$ is the value of the output parameter in chosen units from the system of interest;
k is the constant coefficient that represent the relationship between input and output parameters, for example, it may be a gain of the system.
$\text{Par}_{in}$ is the value of the input parameter in the same units as for output parameters.

A non-linear system requires complex mathematics to describe how output parameter(s) depend on variations of input parameter(s). RF engineers use a Taylor series to evaluate effects from system non-linearity and use two signals excitation. With two input signals applied to a system input port of a nonlinear system, the result is:

$$\text{Vin} = A \cdot (\cos(\omega_1 \cdot t) + \cos(\omega_2 \cdot t)) \tag{3.1}$$

where: Vin is input voltage applied to the system;
A is the amplitude of each input signal;
$\omega_1$ is the frequency of the first applied input signal;
$\omega_2$ is the frequency of the second applied input signal.

Now the output signal can be described as:

$$V_{out} = \alpha_1 [A \cdot (\cos(\omega_1 \cdot t) + \cos(\omega_2 \cdot t))] + \sum_{n=2}^{m} [\alpha_n \cdot [A \cdot (\cos(\omega_1 \cdot t) + \cos(\omega_2 \cdot t))]^n] \tag{3.2}$$

Or, for the first seven orders of Taylor series:

$$V_{out} = \alpha_1 \cdot V_{in}^1 + \alpha_2 \cdot V_{in}^2 + \alpha_3 \cdot V_{in}^3 + \alpha_4 \cdot V_{in}^4 + \alpha_5 \cdot V_{in}^5 + \alpha_6 V_{in}^6 + \alpha_7 \cdot V_{in}^7 \tag{3.3}$$

where: $\alpha_n$ is the Taylor series coefficient that determines the n-order non-linear distortion.

Now Vin can be substituted with its expression (2.1) and simple trigonometrical formulas will get the equation to calculate the exact value for the output signal. This equation is complex and occupies many pages. Note the bulk and complexity of the mathematics required to characterize a nonlinear function.

The reason why conventional mixers are non-linear in the amplitude domain is explained as follows "Mixers perform frequency translation by multiplying two signals (and possibly) their harmonics." This citation is from the well-accepted reference by Behzad Razavi: *RF Microelectronics*. Prentiss Hall PTR. 1998. Page 180. This phrase explains the required non-linearity of prior art mixers. If two signals described by equation (3.1) are inserted into the Taylor series—equations (3.2) or (3.3)—the results of this multiplication are desired and undesired signals. This is the classic explanation of how mixers work. All conventional mixer circuits use amplitude non-linearity as the heart of the mixing function, and amplitude nonlinearity produces unwanted signals, or noise.

In addition, in radio frequency (RF) theory there are other types of non-linearity. One is time domain non-linearity, which imposes less significant penalties in system performance. The present invention uses time domain non-linearity instead of amplitude domain non-linearity. When linear-in-amplitude-domain electronic devices are used in the time domain non-linear mode, the result is an overall reduction in spurious noise. A nonlinear (in the time domain) circuit does not necessarily add spurious energy to the signal passing through the circuit. "Linear-in-the-amplitude-domain" is a feature of an electrical circuit, in which amplitude nonlinearities are not added to the signal passing through the circuit.

The present invention is a frequency mixer/converter in which an input signal such as that from an antenna is mixed with a signal from another source such as an oscillator, to produce an output containing sum and difference signals, and decreased amounts of harmonics, and noise. Because conventional mixer designs are intrinsically nonlinear, the noise component of their output is necessarily substantial and limits the performance of the overall mixer and of the overall system of which the mixer is a part.

The present invention uses linear-in-the-amplitude-domain mixing channels, in which no nonlinear-in-amplitude-domain components are in the signal path or directly affect the signal. Further, the present invention uses unpowered signal path components to ensure that energy from other parts of the circuit does not corrupt the signal. The most generalized version is two linear controllable channels, each with controllable gain or resistance. The function may be digital switching between very low and high gain, or smooth analog gain change between very low and high gain values. In the generalized form, there is only controllable gain. Linear controllable resistance is used only with FET/MOSFET devices.

Figure 18:
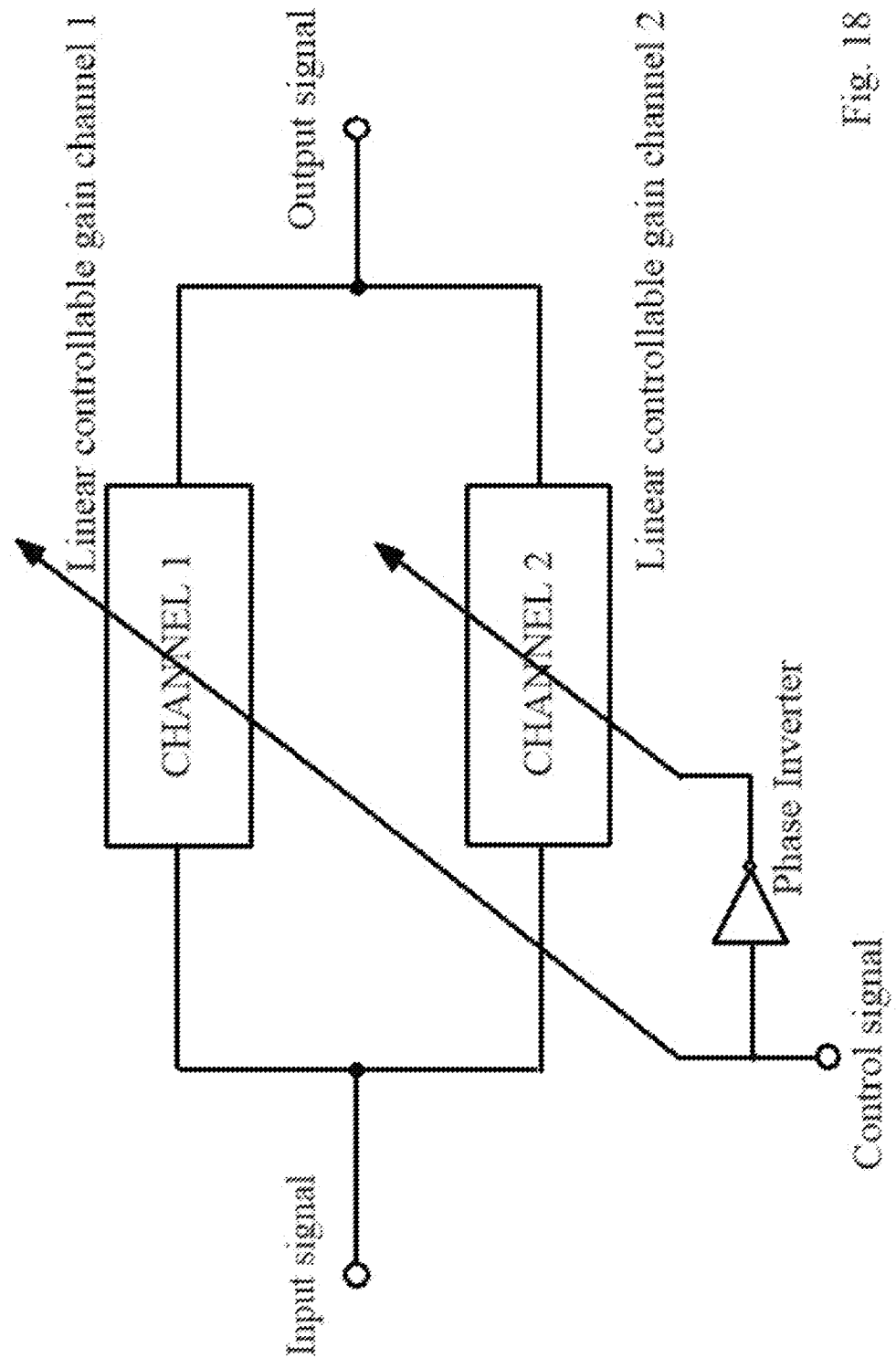
FIG. 18 is a diagram of a RF mixer circuit embodying the principals of the invention.

Referring now to FIG. 18, one embodiment of the RF mixer of the present invention is illustrated. The RF mixer of the present invention employs two equal linear-in-amplitude-domain gain-controlled channels that are connected in parallel and controlled by an LO signal in phase applied to the first channel and an LO signal out of phase (180° shifted phase) applied to the second channel.

Figure 19B:
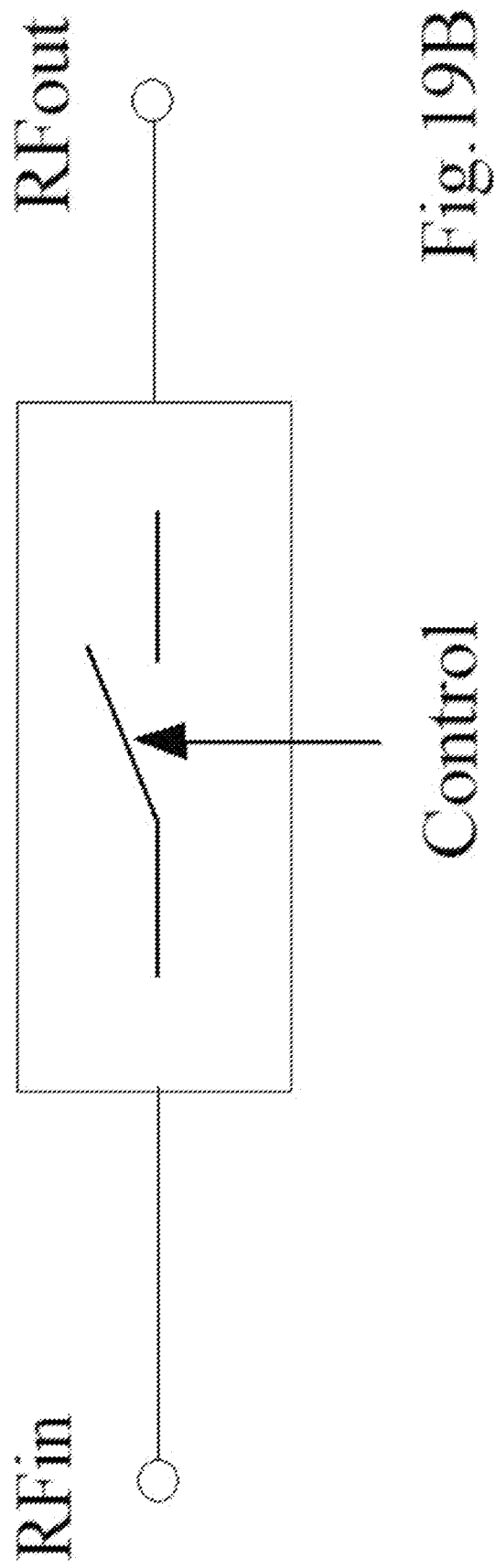
Figure 19C:
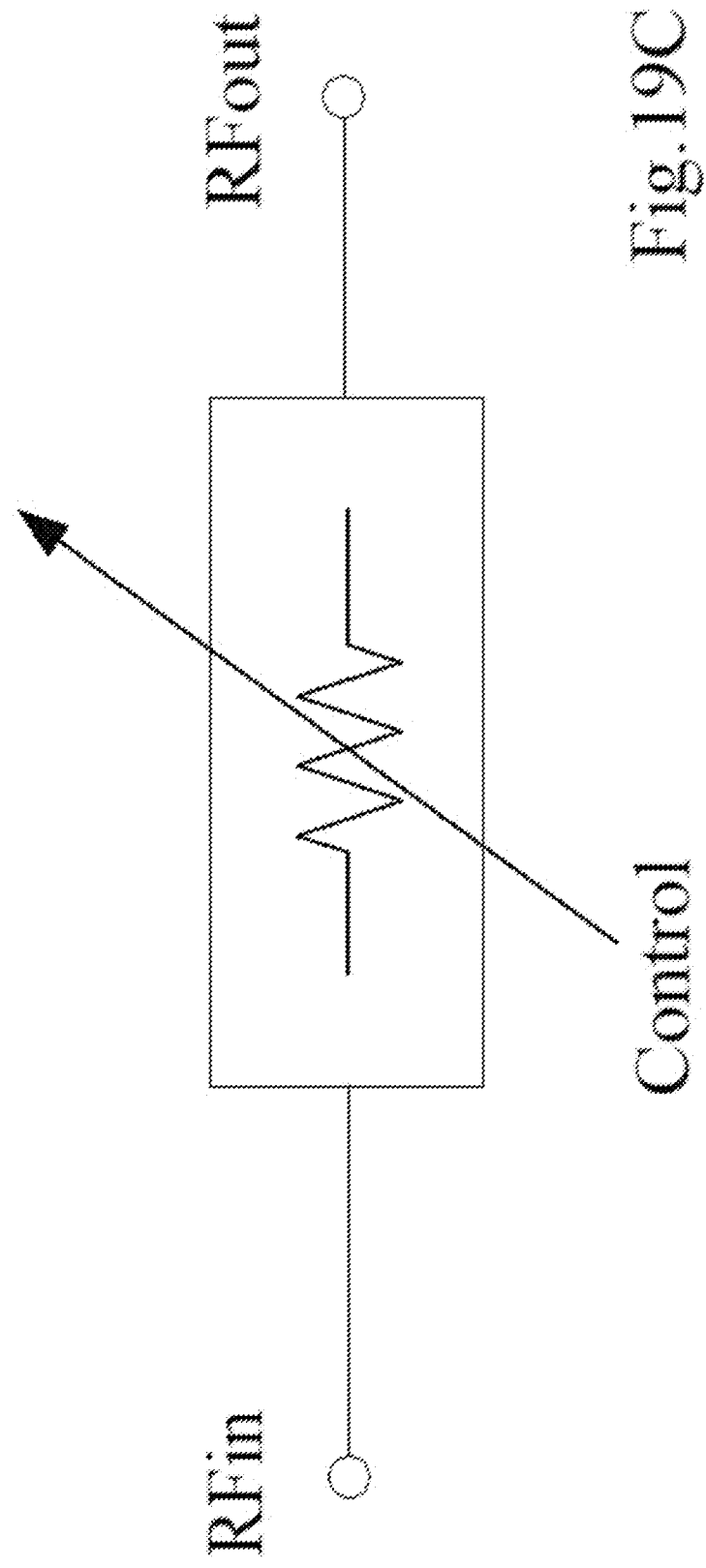

FIGS. 19A-C illustrate components of the RF mixer shown in FIG. 18. FIG. 19 shows three embodiments of the linear controllable gain channels that are created with one of: a controllable attenuator; an RF switch; and an unpowered/passive FET/MOSFET operating as a controllable resistance.

In the preferred embodiment, an RF signal is applied to the input of the linear controllable gain (mixing) channels. A local oscillator (LO) supplies a control signal which is applied directly to one linear controllable mixing channel. That control signal also goes to a phase inverter, the output of which is applied to the second linear controllable mixing channel. The local oscillator controls those linear controllable channels (switches, FETs in linear controllable resistance mode, or controllable attenuators) in accordance with a waveform that optimizes the function of the channels. The outputs of the linear controllable channels are then combined to produce mixer products containing the sum and difference of the input signals and double LO frequency. In most mixer applications, a filter is used to select the desired mixer product as the output of the mixer, suppressing other mixer products. Attenuators with a few dB of insertion loss may be connected to the mixer's ports to improve matching (not shown). Because the LO frequency is effectively doubled, the band between that signal and the RF signal is increased, facilitating filtering.

In the present invention, the "linear controllable channel" can be an RF switch or a device that can be made to control gain, such as a controllable attenuator or a field effect transistor (FET or MOSFET) in linear controllable resistance mode. The requirement is that the device be operated as a controllable channel that is intrinsically linear in the amplitude domain. A FET/MOSFET operates as an unpowered linear controllable channel. In any of those iterations, the controllable channel comprising the mixing element interrupts or controls the input RF signal in accordance with the control signal provided by the local oscillator. All embodiments effectively isolate the local oscillator from the mixing channel, except insofar as the local oscillator controls the mixing function. The isolation of LO current from the mixing channel circuit serves to further reduce noise of the overall circuit.

The present invention minimizes harmonics in the output, further reducing noise. One feature of the present invention is comprised of wiring/connections between only three components, and then two controllable channels (attenuators, switches, or FETs/MOSFETs operating unpowered in linear controllable resistance mode) and a phase inverter. There are many variations of the RF input circuit and the LO circuit that operate the controllable channel and a selective filter to suppress undesired components in the output signal can also be employed (not shown).

As illustrated in FIG. 18, one embodiment of the present invention consists of a first device operating as a linear controllable gain channel, to which the input RF signal is applied. That device functions as a mixing channel. A second device operating as a linear controllable gain channel, to which the input RF signal is applied. That device functions as a mixing channel. The LO signal controls the linear controllable channels in the mixer but does not actually appear in the signal path of the linear controllable gain channel, and therefore no LO current appears in the output signal. A phase inverter to which the LO is applied, resulting in two control signals applied to the linear controllable gain channels; one is the LO in-phase, and the other is the LO in the opposite phase (180 degrees opposite). Thus, the two linear controllable channels operate out of phase, the first in all odd halves of the LO signal, and the second in all even halves of the LO signal. Because the present invention uses linear controllable gain channels as a time-variance system, thus avoiding nonlinearities in the amplitude domain, the output signal does not include noise products generated by amplitude nonlinearities. Another embodiment of the present invention may employ a controllable attenuator. It will be appreciated that "linear controllable resistance" is possible with FETs and MOSFETs in "unpowered controllable resistance mode". RF switches and RF controllable attenuators use attenuators' topologies, not controllable resistance. An RF switch uses only high and low stages of attenuation, whereas controllable attenuators may be set to any attenuation between available low and high limits. Therefore, an RF switch may be used for digital mixing and an RF controllable attenuator may be used for both linear (for example, sinusoidal signals) and digital (switching) mixing.

Another embodiment of the present invention may employ PIN-diode based RF switches. This kind of RF switch can handle very high RF power levels, therefore a PIN-diode based mixer will be able to mix high-level RF signals and have higher IP3 parameters (linearity). Other embodiments of the present invention may be used as detector. For example, mixers are often used as detectors and the very first term for a mixer was a detector. Embodiments of the present invention may be used as "synchronous detectors" and as "synchronous rectification" detectors and circuits. Synchronous detectors are widely used in special (mostly military) radio communications. Synchronous rectification is very popular today in wireless power transmission technologies.

Performance of the controllable gain channel defines much of the performance of the present invention and therefore the performance of the system of which it is a part. The following parameters are part of the design criteria of the present invention.

IP3 : Ideally, this parameter should at the highest possible level. In today's RF and microwave mixer applications, it should be at least 80 dBm. The IP3 level of the mixing channel will determine the overall system linearity.

Speed: When the channel includes a switch, the required switching time can be approximated by:

$$T = \frac{0.7}{F_h}$$

where T is the sum of ON and OFF time as $T = t_{ON} + t_{OFF}$ and $F_h$ is the highest working frequency for the mixer.

Summary switching or operating time [ON time+OFF time]: Summary switching time of the switch should be less than 70% of the half of the signal time period. For example, operation in the frequency range up to 1 GHz requires summary switching time (or operating time) below 350 picoseconds.

Power handling: Power handling capacity of RF switches, FETs, MOSFETs, and controllable attenuators is often not published. In the present invention, that parameter should be maximized. Suitability of a candidate component can be measured by using any of the known circuits that apply measured power to the device under test (DUT), then increasing power until the DUT fails.

Field effect transistor (FET and MOSFET) used as a switch or linear controllable resistor: FET/MOSFET transistors are suitable for use as radio frequency switches in the present invention if they comply with the following: The FET or MOSFET should be used in "controllable resistance mode" without applying any voltage to the drain-source circuit. To function in that position, the transistor should be the enhanced mode type with low required Gate Threshold Voltage. The lower this required voltage, the lower LO amplitude is required to control the resistance of the drain-source channel. Transistors with a high Gate Threshold Voltage would require special gate bias, which would complicate the circuitry and add a potential source for noise.

Preferably, the transistor should have low resistance for its drain-source channel. It will ensure low insertion loss for the present invention and also will reduce the noise figure for the mixer. Also, the transistor should have fast switching. This parameter can be determined by the same means as used to qualify RF switches. And, the transistor should have the highest possible IP3 value, which will determine the overall system linearity. Input impedance for the Control (LO) port should be not less than 5,000 ohms to reduce required LO power and reduce the effect of the LO upon the output signal. In sets, transistors should be matched as close one to one another as possible in all parameters. Some 2-FET chips are available with suitable matched performance, but selection is still required. Input and output ports impedance of the mixer should be close to 50 ohms with minimal reactive components, in order to match standard RF impedance.

Controllable attenuators when used as a switch or controllable resistor: An attenuator can be used to linearly interrupt or control the RF signal with the LO control signal when used as a linearly controllable channel if the attenuator complies with the following: Insertion loss should be low. In most embodiments of the present invention it should be below 1 dB. Maximum attenuation should be high; in embodiments of the present invention it should be above 60 dB. Switching speed is important. A candidate attenuator must switch between lower and higher attenuation states with very short switching time. This parameter can be determined by the same equation as defines speed of an RF switch. The attenuator should have the highest possible IP3 value, which will determine the overall system linearity.

All components, including the attenuator chips, should be as well-matched as possible. Two equal attenuators in one chip package is preferable, and matching should be validated. This is critical because it will ensure the cleanest output signals from the mixer. Port isolation should be not less than 60 dB between all RF and Control (LO) ports. RF port impedance of the mixer should be close to 50 Ohms with minimal reactive components. High input impedance for the Control (LO) port, should be not less than 5,000 ohms, to reduce required LO power and make output signals cleaner.

Component selection/qualification and circuit assembly of the RF mixer of the present invention will now be discussed. In order to obtain high quality mixing and low noise level at the output, the circuit generally requires at least 60 dB isolation between all RF and LO ports. Input impedance for the control (LO) port should be at least 5,000 ohms. That reduces required LO power, which makes output signals cleaner even though the LO does not actually appear in the mixer channel. The layout should prevent leakage of LO current to the signal path. Input impedance for the mixer's signal (RF) port should be close to 50 ohms with minimal reactive components in the circuit. Circuit and board design should maximize isolation between the traces carrying signals from the RF and IF ports and control (LO) lines. Isolation between the RF mixer's ports and all other circuit traces may affect mixer performance. For most known mixers the average isolation is about 10-20 dB. The present invention enables substantial improvement of that parameter.

With RF switches, typical isolation between RF ports is about 50 to 70 dB, as shown in many published product datasheets. Unfortunately, the information applies only to isolation between RF ports—$RF_{IN}$ and $RF_{OUT}$. Isolation between Control (LO) and RF ports is not usually in the literature, but because it is an important characteristic of the current invention, it often must be determined experimentally. From known topology of the RF switches, isolation should be better than between RF ports, or 40-60 dB, due partly to the use of balanced circuits for the control signal lines. Therefore, isolation between control input and RF ports should be at least 90-130 dB, and with careful design can often be higher. Average isolation between RF ports and RF simulation for a known RF switch, such as ADRF5024 from Analog Devices, Inc. is adequate.

Figure 20:
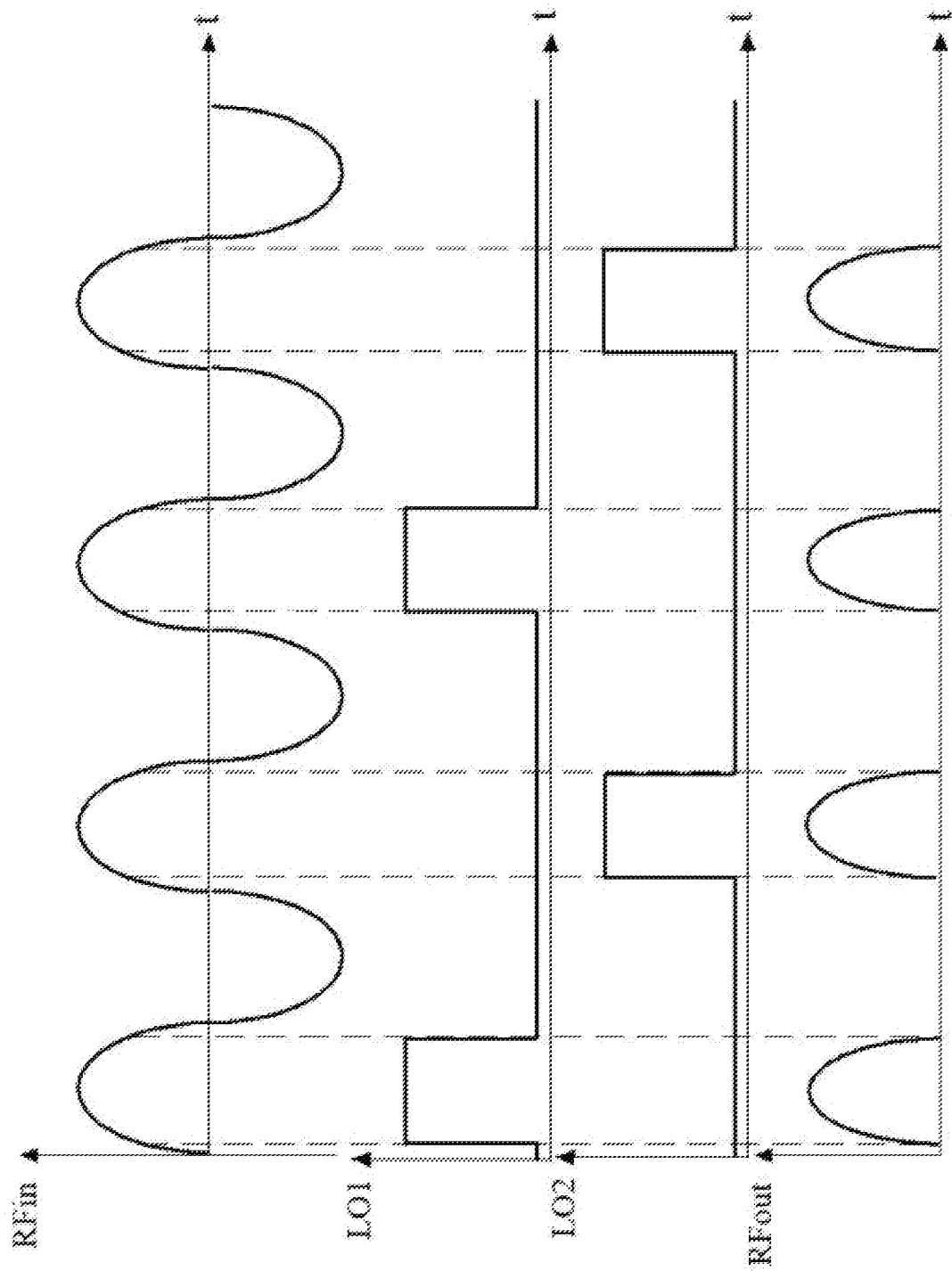
FIG. 20 illustrates theoretical simulations of local oscillator waveforms.

Referring now to FIG. 20, illustrations of theoretical simulations of local oscillator waveforms are shown. For the present invention to function optimally, specific waveform(s) should be generated by the local oscillator (LO). That waveform requirement is a component of the present invention, and further differentiates it from conventional mixers. The switching point (the moment when a linear controllable channel starts to conduct electrical current from input to the output) depends on the LO waveform. For an ideal rectangular LO signal with zero switching time, the theoretical simulations for the signals are shown in FIG. 20. Each conductive period of each channel should be no longer than half of the LO signal period. When duration of the conductive period is equal to one half of the period the result is an output that is exactly one-half wave of the RF input waveform. FIG. 20 shows the duty cycle at slightly less than 50% (a practical value) for the LO signal.

Figure 21A:
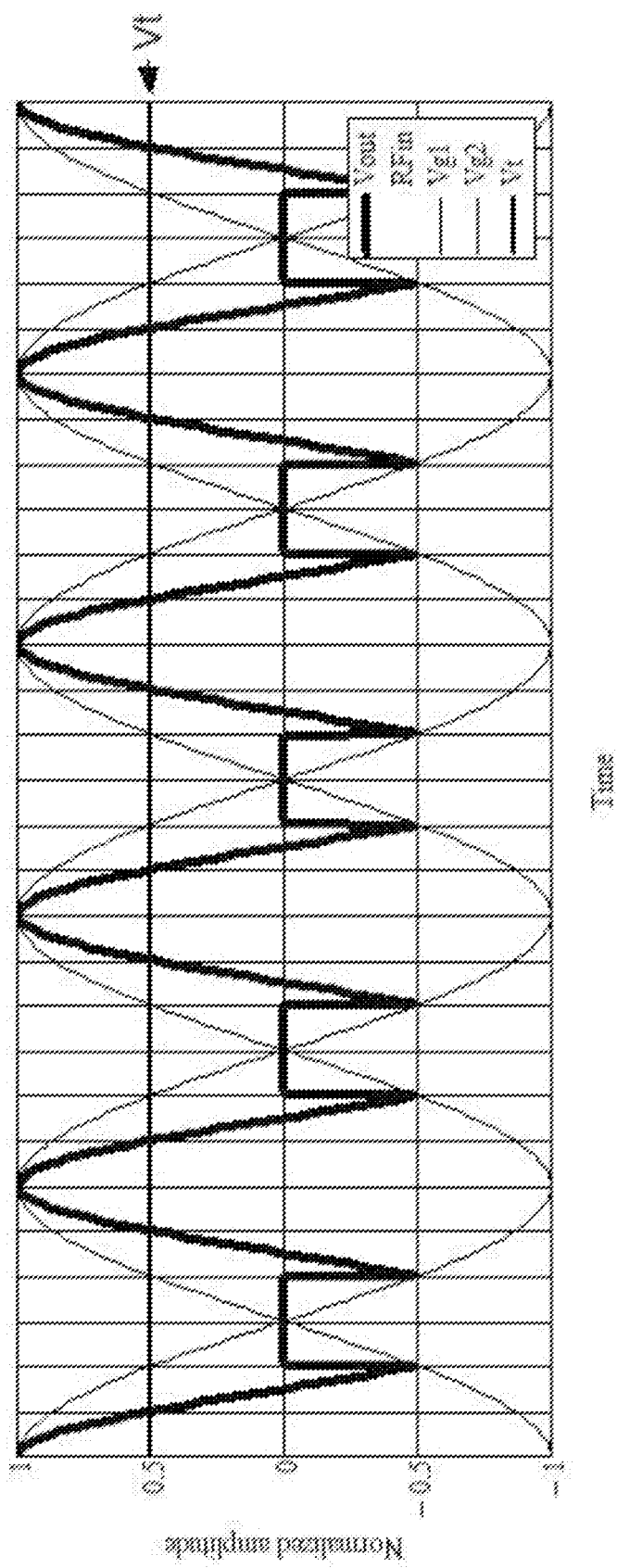
FIG. 21A-C illustrates different threshold voltages.
Figure 21B:
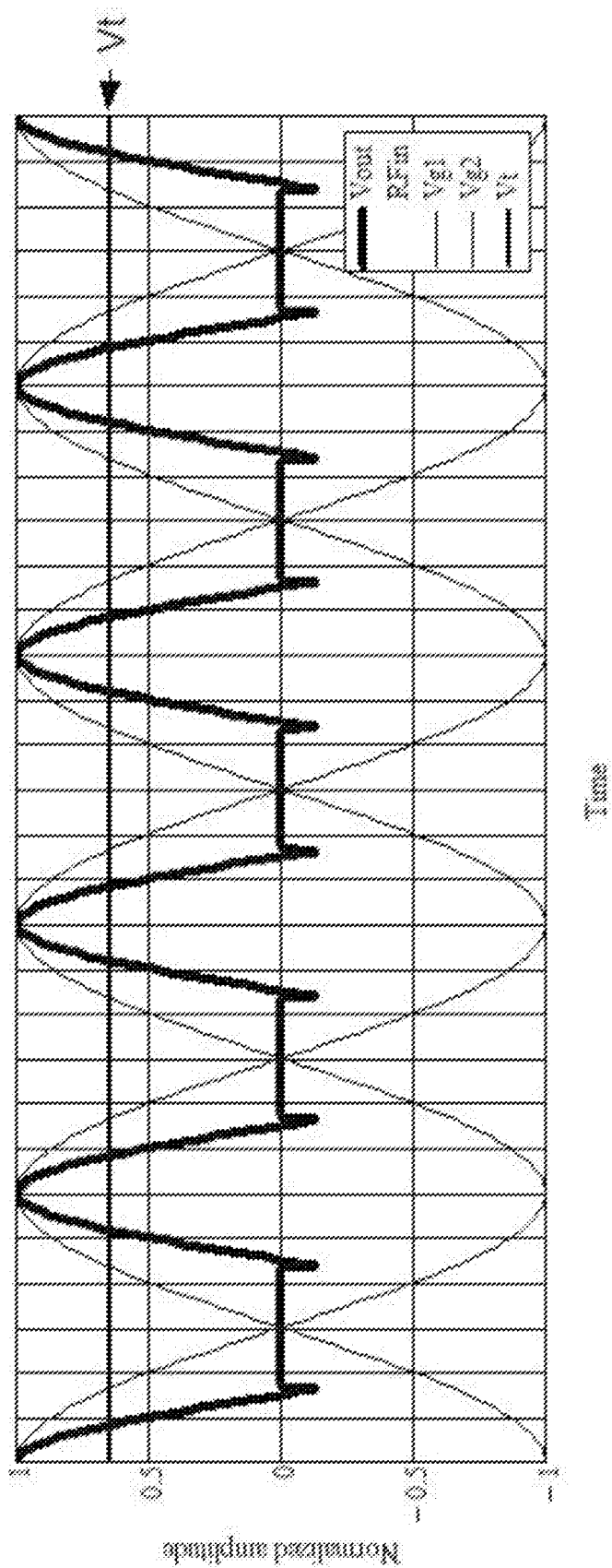
Figure 21C:
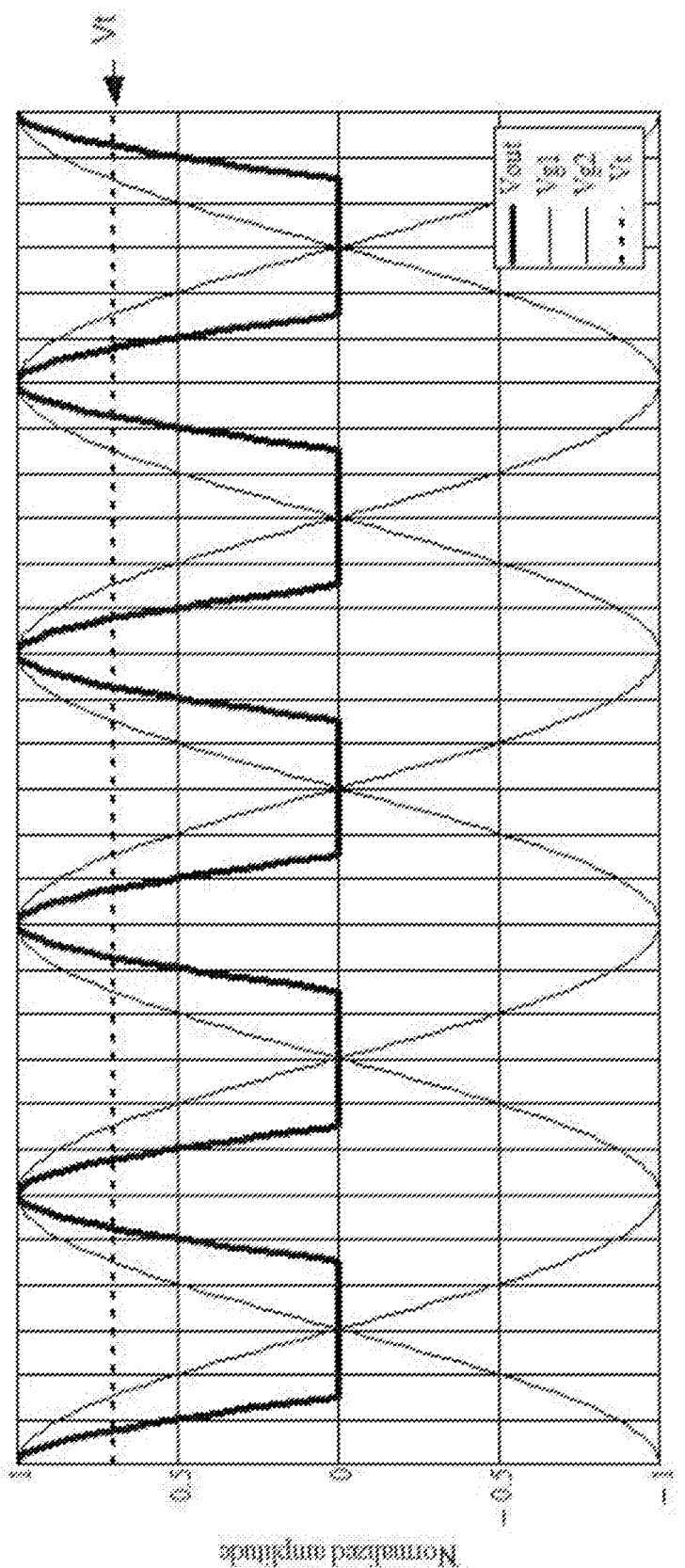

FIGS. 21A-C show different threshold voltages. When LO rectangular signals are not ideal, switching requires more time and the duty cycle must be reduced accordingly. Practical tests of the present invention show that for rectangular LO waveforms, the duty cycle should fall in the 30-40% range, with 35% close to optimal. With sinusoidal LO wave-forms the threshold voltage for transistors Vt must be adjusted with external gate bias to obtain minimum distortion. Practical tests of the present invention showed that Vt equal to 70% of maximum signal amplitude is optimal. That means that the normalized value for the threshold voltage must be close to 0.7. This case is presented in FIGS. 21A-C for Vt=0.5; Vt=0.65; and Vt=0.7 accordingly.

Figure 22:
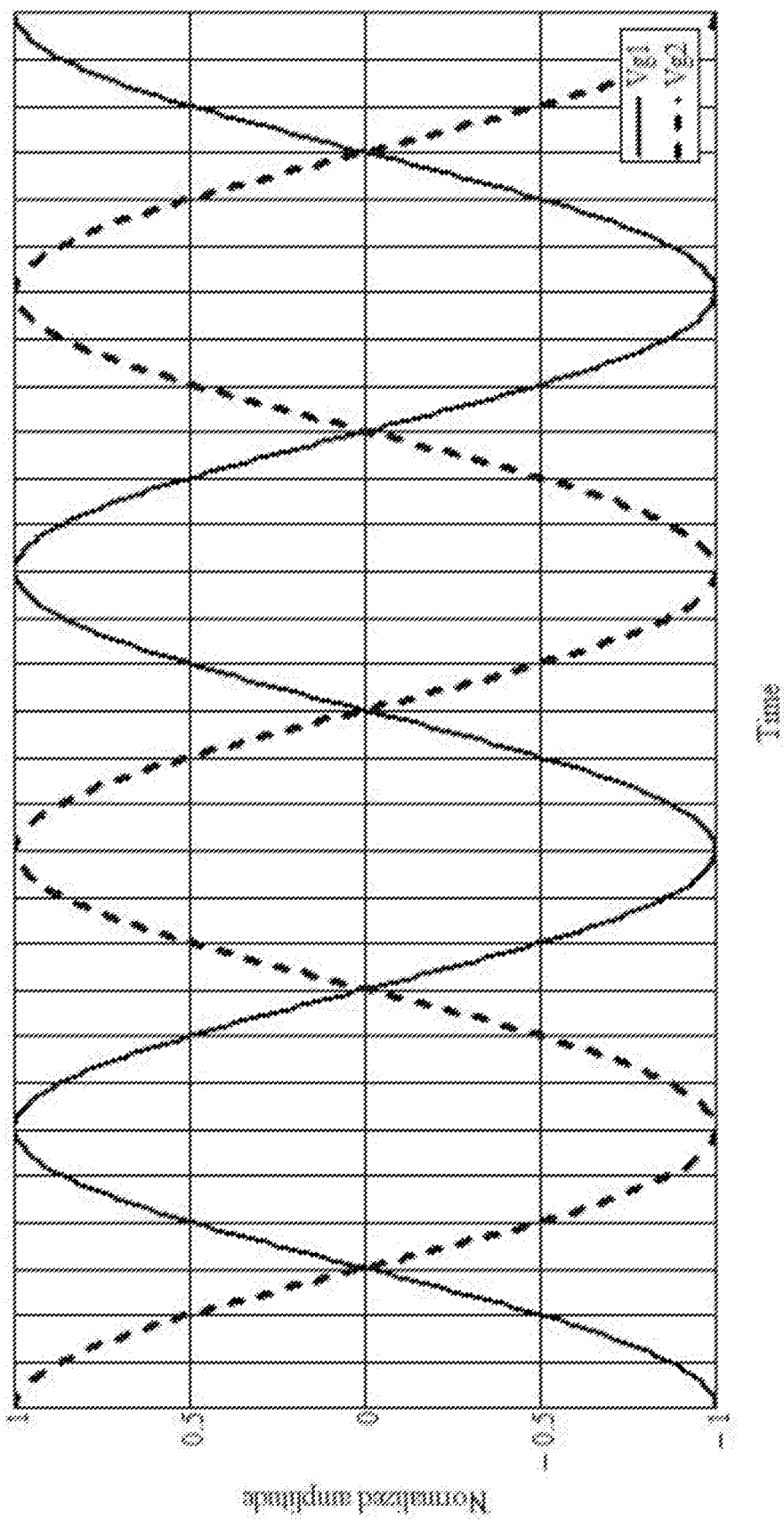
FIG. 22 illustrates a sinusoidal waveform.
Figure 23:
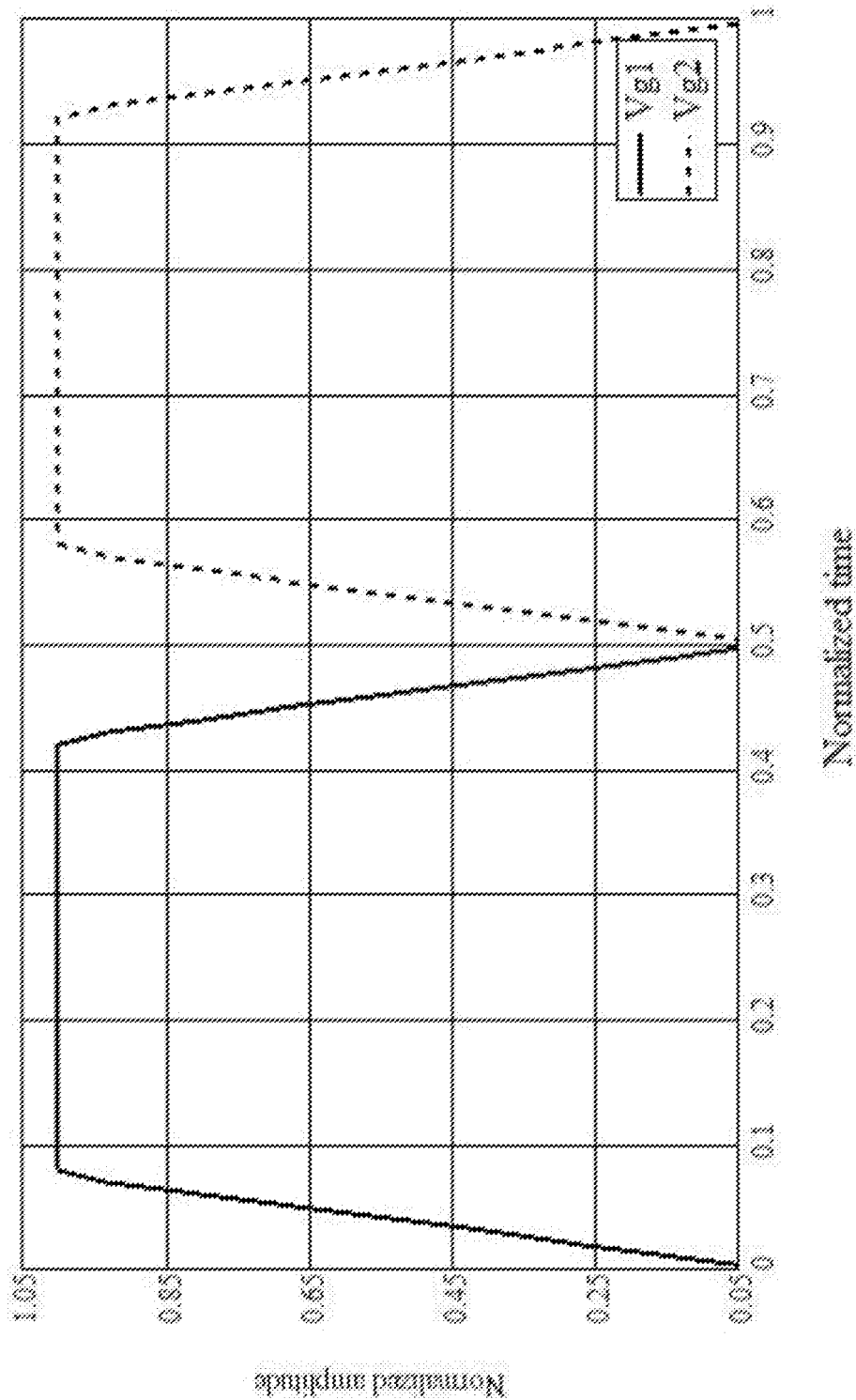
FIG.23 shows a meander-type waveform.

Shown in FIG. 22 is a sinusoidal waveform-was used to drive switching of the RF mixer. FIG. 23 shows a real meander-type waveform. This waveform also was tested to drive switching of the RF mixer. A pulse waveform was also tried with non-continuous signals and a positive voltage only for a 35% signal period. That waveform produced good switching.

Figure 24:
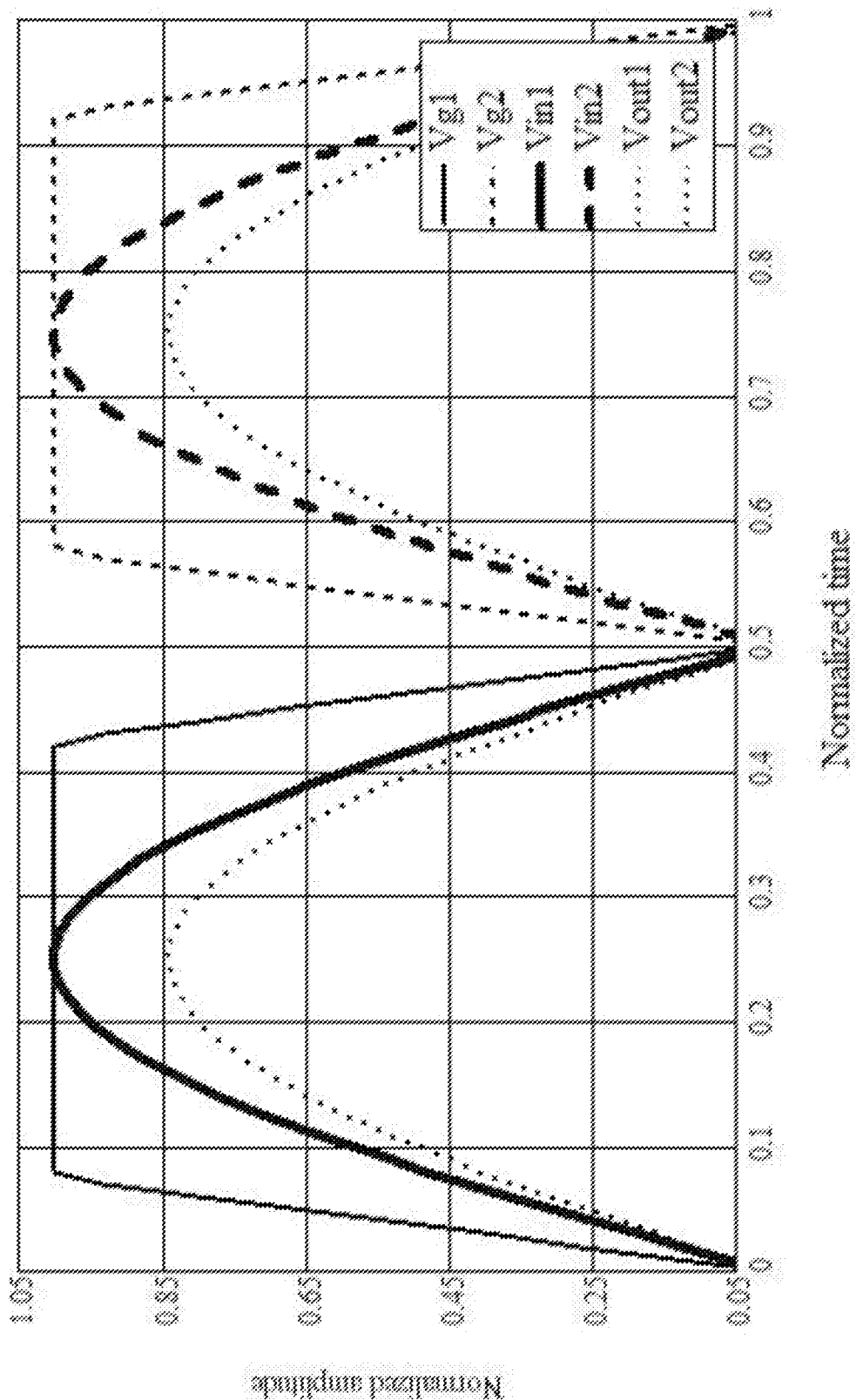
FIG.24 shows one preferred gate driving waveform.

FIG. 24 shows the switching process with a rectangular waveform at 35% duty cycle. One major contributor to the distortion is changing channel impedance due to the switching characteristics of the FET/MOSFET that is employed in the RF mixer of the present invention. Output positive pulses are well synchronized with the switching pulses, and with proper biasing will produce only positive output voltage. That is the pure synchronous rectification process, the goal of the switching.

FIG. 24 shows the end result from a rectangular waveform and 35% duty cycle, with all operating parameters optimized. It is important to note that a significant deviation from this experimentally-defined gate driving waveform may degrade overall switching performance.

Unless defined otherwise, all technical and scientific terms used herein have the same meaning as is commonly understood by one of skill in the art to which this invention belongs. In addition, as used herein, "attenuator" is one means of controlling the amplitude of an RF signal within a mixing channel. "Controllable gain" is a circuit gain that can be controlled. "Controllable resistance" is a circuit resistance that can be controlled. "Converter" is a term interchangeable with mixer. "Diode-based mixer" is a passive circuit that can mix frequencies, used when spurious energy (noise) is not a factor. "Field effect transistor" (FET) is one means of opening and closing the signal path within a mixing channel. "Filter" is an electrical circuit that passes certain frequencies while suppressing others. "Harmonic" is any multiple of a signal's frequency. "Intermediate frequency" (IF) is a term usually used in RF engineering to identify the output of a mixer. "Linear controllable channel" is a signal channel in which a means is provided to linearly control the amplitude of the RF signal in the circuit. "Linear controllable resistance mode" is a mode in which FET/MOSFET devices can operate, in which they function as linear resistors. "Linear-in-the-amplitude-domain" is a feature of an electrical circuit, in which amplitude nonlinearities are not added to the signal passing through the circuit. A nonlinear (in the time domain) circuit does not necessarily add spurious energy to the signal passing through the circuit. "Local oscillator" (LO) is the signal to be mixed with the input RF signal. In the present invention, the LO is a control signal that manipulates the RF signal path in accordance with the LO frequency, but is not directly mixed with the RF signal. "Microwave frequency" comprises frequencies above $10^9$ Hz. "Mixer" is a circuit that combines frequencies, or effectively converts a signal from one frequency to another. "Mixing channel" or "channel" is a circuit path for the RF signal being mixed. "Phase inverter" is a circuit device that inverts a signal's phase, typically by 180 degrees. "Radio frequency" or RF are frequencies between $10^6$ to $10^9$ Hz. "RF switch" is a switch that can linearly open or close a signal path through a circuit, effectively controlling the amplitude of a signal passing through the circuit. "Switch" is one means of opening and closing the signal path within a mixing channel. "Third order intercept point" (IP3) is a purely mathematical parameter for defining the performance of RF devices such as receivers, amplifiers, and mixers. "Unpowered linear controllable channel" is a circuit comprised of unpowered/passive devices, in which the amplitude of an RF signal is manipulated by a control signal. A "spurious" emission is any radio frequency not deliberately created or transmitted, especially in a device which normally does create other frequencies.

It is to be noticed that the term "including," "comprising," and variations thereof as used in the claims should not be interpreted as being limitative to the means or elements listed thereafter. Thus, the scope of the expression "a device comprising A and B" should not be limited to devices consisting only of components A and B. It means that with respect to the present invention, the only relevant components of the device are A and B. That is, the terms "including", "comprising" and variations thereof mean "including but not limited to", unless expressly specified otherwise. Thus, use of the term "comprising" indicates that the listed elements are required or mandatory, but that other elements are optional and may or may not be present. The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise. The terms "a", "an" and "the" mean "one or more", unless expressly specified otherwise. Devices that are in communication with each other need not be in continuous communication with each other, unless expressly specified otherwise. In addition, devices that are in communication with each other may communicate directly or indirectly through one or more intermediaries. A description of an embodiment with several components in communication with each other does not imply that all such components are required. On the contrary a variety of optional components are described to illustrate the wide variety of possible embodiments of the present invention.

Thus, it is seen that a frequency mixer is provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims. For example, the components of the systems and apparatuses may be integrated or separated. Moreover, the operation of the RF mixer and apparatuses disclosed herein may be performed by more, fewer, or other components and the methods described may include more, fewer, or other steps. Additionally, steps may be performed in any suitable order. Any one or more of the foregoing embodiments may well be implemented in silicon, hardware, firmware, software and/or combinations thereof.

The particular illustrated example embodiments are not provided to limit the invention but merely to illustrate it. Thus, the scope of the present invention is not to be determined by the specific examples provided above but only by the plain language of the following claims. To aid the Patent Office and any readers of any patent issued on this application in interpreting the claims appended hereto, applicants wish to note that they do not intend any of the appended claims or claim elements to invoke 35 U.S.C. 112(f) unless the words "means for" or "step for" are explicitly used in the particular claim.

What is claimed is:

1. A radio frequency (RF) mixer, comprising:
two linear-in-the-amplitude-domain RF channels connected in parallel, each of the two linear-in-the-amplitude-domain RF channels comprised of an input RF signal applied equally to each channel;
two controllable gain devices structured to receive the input RF signal;
a local oscillator (LO) communicating with both of the controllable gain devices, with one of the controllable gain devices receiving a signal from the LO directly, and the other controllable gain device receiving a signal from the LO after a phase of the LO signal is reversed by a phase inverter; and
an output of each of the linear-in-the-amplitude-domain RF channels combined to form a common intermediate frequency (IF) output.

2. The radio frequency (RF) mixer of claim 1, where each controllable gain device comprises a radio frequency switch.

3. The radio frequency (RF) mixer of claim 1, where each controllable gain device comprises a PIN-diode radio frequency switch.

4. The radio frequency (RF) mixer of claim 1, where each controllable gain device comprises a controllable attenuator.

5. The radio frequency (RF) mixer of claim 1, where each controllable gain device comprises an unpowered field effect transistor (FET) operated in a linear controllable resistance mode.

6. The radio frequency (RF) mixer of claim 1, where each controllable gain device comprises an unpowered metal oxide semiconductor field effect transistor (MOSFET) operated in a linear controllable resistance mode.

7. The radio frequency (RF) mixer of claim 1, where the signal from the LO is isolated from a signal path of the input RF signal so that a current from the LO is prevented from adding additional spurious energy to the input RF signal.

8. The radio frequency (RF) mixer of claim 1, where the LO is isolated from an input port and an output port of the RF mixer to prevent a current from the LO from adding additional spurious energy to the input and output RF signals.

9. The radio frequency (RF) mixer of claim 1, where the RF mixer operates in a passive mode, with no external power supply voltage applied to the RF signal path of the two linear-in-the-amplitude-domain RF channels.

10. The radio frequency (RF) mixer of claim 1, where the RF mixer comprises an unpowered circuit that does not use diodes.

11. A radio frequency (RF) mixer comprising:
two parallel linear-in-the-amplitude-domain controllable gain channels, with a common input port for receiving an input RF signal to be mixed;
a common output port for the mixed signal, with one of the linear-in-the-amplitude-domain controllable gain channels connected directly to and operated by a signal from a local oscillator (LO), with the other linear-in-the-amplitude-domain controllable gain channel connected to and operated by an output of a phase inverter, that receives an input from the LO, with the output of the phase inverter shifted 180 degrees relative to the input from the LO;
thus operating the two linear-in-the-amplitude-domain controllable gain channels in opposition, where whenever one linear-in-the-amplitude-domain controllable gain channel provides a maximum gain the other linear-in-the-amplitude-domain controllable gain channel provides a minimum gain.

12. The radio frequency (RF) mixer of claim 10, where each controllable gain device comprises a radio frequency switch.

13. The radio frequency (RF) mixer of claim 10, where each controllable gain device comprises a radio frequency switch comprising a Pin-diode.

14. The radio frequency (RF) mixer of claim 10, where each controllable gain device comprises a controllable attenuator.

15. The radio frequency (RF) mixer of claim 10, where each controllable gain device comprises an unpowered field effect transistor (FET) operated in a linear controllable resistance mode.

16. The radio frequency (RF) mixer of claim 10, where each controllable gain device comprises an unpowered metal oxide semiconductor field effect transistor (MOSFET) operated in a linear controllable resistance mode.

17. The radio frequency (RF) mixer of claim 10, where the signal from the LO is isolated from a signal path of the input RF signal so that a current from the LO is prevented from adding additional spurious energy to the input RF signal.

18. The radio frequency (RF) mixer of claim 10, where the LO is isolated from an input port and an output port of the RF mixer to prevent a current from the LO from adding additional spurious energy to the input and output RF signals.

19. The radio frequency (RF) mixer of claim 10, where the RF mixer operates in a passive mode, with no external power supply voltage applied to a signal path of the two linear-in-the-amplitude-domain RF channels.

20. The radio frequency (RF) mixer of claim 10, where the RF mixer comprises an unpowered circuit that does not use diodes.

\* \* \* \* \*

UNITED STATES PATENT AND TRADEMARK OFFICE
CERTIFICATE OF CORRECTION

PATENT NO. : 10,622,946 B1
APPLICATION NO. : 16/223641
DATED : April 14, 2020
INVENTOR(S) : Sam Belkin Page 1 of 1

It is certified that error appears in the above-identified patent and that said Letters Patent is hereby corrected as shown below:

In the Claims

At Column 9, Line 45, please delete the following sentence:
"Conventional mixers achieve an IP3 level better than 100 dBm."

Signed and Sealed this
Twenty-fourth Day of September, 2024

Katherine Kelly Vidal
*Director of the United States Patent and Trademark Office*